United States Patent
Ni et al.

(10) Patent No.: US 12,136,915 B2
(45) Date of Patent: Nov. 5, 2024

(54) CAPACITIVE SENSOR, ELECTRONIC DEVICE, AND ELECTRONIC DEVICE CONTROL METHOD

(71) Applicants: HUAWEI TECHNOLOGIES CO., LTD., Shenzhen (CN); National University of Singapore, Singapore (SG)

(72) Inventors: Gang Ni, Nanjing (CN); Xijin Tan, Shenzhen (CN); Qirui Huang, Singapore (SG); Lifeng Sun, Shenzhen (CN); Huimin Zhang, Shenzhen (CN); Yida Li, Singapore (SG)

(73) Assignees: Huawei Technologies Co., Ltd, Shenzhen (CN); National University of Singapore, Singapore (SG)

( * ) Notice: Subject to any disclaimer, the term of this patent is extended or adjusted under 35 U.S.C. 154(b) by 142 days.

(21) Appl. No.: 17/953,080

(22) Filed: Sep. 26, 2022

(65) Prior Publication Data
US 2023/0015735 A1 Jan. 19, 2023

Related U.S. Application Data

(63) Continuation of application No. PCT/CN2020/081363, filed on Mar. 26, 2020.

(51) Int. Cl.
*H03K 17/955* (2006.01)
*G06F 3/01* (2006.01)
*H03K 17/945* (2006.01)

(52) U.S. Cl.
CPC .......... *H03K 17/955* (2013.01); *G06F 3/011* (2013.01); *G06F 3/017* (2013.01); *H03K 2017/9455* (2013.01)

(58) Field of Classification Search
CPC .......... H03K 17/955; H03K 2017/9455; G06F 3/011; G06F 3/017; G06F 3/014; G06F 3/0443; G06F 3/0448; G06F 2203/04101
See application file for complete search history.

(56) References Cited

U.S. PATENT DOCUMENTS

| 5,048,165 A * | 9/1991 | Cadwell ................ G01L 9/0042 340/870.37 |
| 2009/0165572 A1 * | 7/2009 | Harish ................... G01L 1/142 73/862.626 |

(Continued)

FOREIGN PATENT DOCUMENTS

| CN | 102374885 A | 3/2012 |
| CN | 104078216 A | 10/2014 |

(Continued)

OTHER PUBLICATIONS

Hurtado et al. | "Flexible Microdisplacement Sensor for Wearable/Implantable Biomedical Applications" | NPL Year: 2017| IEEE Xplore | IEEE Periodicals| 2017-04-26| IEEE Sensors Journal | pp. 3873-3883.*

(Continued)

*Primary Examiner* — Akm Zakaria
(74) *Attorney, Agent, or Firm* — Leydig, Voit & Mayer, Ltd.

(57) ABSTRACT

A capacitive sensor, an electronic device, and an electronic device control method are disclosed and relate to the field of sensor technologies. The capacitive sensor includes at least one plate pair. Each plate pair includes a first plate and a second plate that are placed opposite to each other. A ratio of a plate length of each plate pair to a spacing in the plate pair is greater than 1 and less than or equal to 30. The capacitive sensor can detect an air gesture of a user based on fringe field effect and has advantages of a small size and low energy consumption.

9 Claims, 11 Drawing Sheets

(56) References Cited

U.S. PATENT DOCUMENTS

| | | | |
|---|---|---|---|
| 2014/0028334 A1* | 1/2014 | Liu | G06F 3/044 |
| | | | 324/679 |
| 2015/0237183 A1* | 8/2015 | Novet | H04M 1/72454 |
| | | | 455/556.1 |
| 2016/0054850 A1 | 2/2016 | Aubauer et al. | |
| 2017/0308205 A1 | 10/2017 | Cheng et al. | |
| 2018/0343023 A1 | 11/2018 | Park et al. | |
| 2019/0132948 A1* | 5/2019 | Longinotti-Buitoni | |
| | | | A61B 5/6805 |
| 2019/0369811 A1* | 12/2019 | Hsu | G06F 3/0445 |
| 2021/0091781 A1* | 3/2021 | Chiang | H03M 1/0678 |
| 2021/0195732 A1* | 6/2021 | Longinotti-Buitoni | |
| | | | H05K 3/361 |

FOREIGN PATENT DOCUMENTS

| | | |
|---|---|---|
| CN | 104364745 A | 2/2015 |
| CN | 109283998 A | 1/2019 |
| CN | 110044976 A | 7/2019 |
| CN | 110346837 A | 10/2019 |
| CN | 110554788 A | 12/2019 |

OTHER PUBLICATIONS

Jun et al., "Simulation of Interdigitated Electrodes (IDEs) Geometry Using COMSOL Multiphysics," 2018 International Conference on Intelligent and Advanced System (ICIAS), Total 6 pages, Institute of Electrical and Electronics Engineers, New York, New York (Aug. 13-14, 2018).

Microchip, "Single-Zone 3D Gesture Controller Data Sheet," MGC3130, DS41667A, https://www.mouser.com/datasheet/2/268/41667A-278049.pdf, Total 41 pages, Microchip Technology Inc. (Dec. 11, 2012).

* cited by examiner

10004a: A processor recognizes an air gesture of a user based on correspondences between a digital signal and various gestures 10004b: The processor determines an associated operation command matching the air gesture of the user in an air gesture library 10004c: The processor controls an electronic device to execute the associated operation command matching the air gesture of the user

FIG. 23

CAPACITIVE SENSOR, ELECTRONIC DEVICE, AND ELECTRONIC DEVICE CONTROL METHOD

CROSS-REFERENCE TO RELATED APPLICATIONS

This application is a continuation of International Application No. PCT/CN2020/081363, filed on Mar. 26, 2020, the disclosure of which is hereby incorporated by reference in its entirety.

TECHNICAL FIELD

This application relates to the field of sensor technologies, and more specifically, to a capacitive sensor, an electronic device, and an electronic device control method.

BACKGROUND

Gesture recognition generally means that a user interacts with or controls a device by using some gestures without touching the device. For example, a gesture made by the user may be detected by using some sensors, and then the electronic device is controlled, based on the gesture made by the user, to perform a corresponding operation.

An existing gesture recognition solution is generally implemented based on technologies such as an electromagnetic wave (such as a millimeter wave, an infrared ray, and an ultrasonic wave) and machine vision. A dedicated sensor and a matching circuit are generally required for gesture recognition performed in these manners, and therefore occupy large space and consume high energy when an entire system (including a corresponding sensor, a signal processing circuit, and the like) works.

For example, a millimeter wave gesture recognition solution is used as an example. In this solution, a time interval, a phase, and a frequency difference between a transmitted signal and a received reflected signal of a radar are mainly used to recognize a corresponding gesture. In this solution, a dedicated radar sensor chip is required and needs to occupy large storage space. In addition, because a calculation amount is large when gesture recognition is performed in this solution, energy consumed when the entire system works is high.

SUMMARY

This application provides a capacitive sensor, an electronic device, and an electronic device control method. The capacitive sensor in this application can detect an air gesture of a user based on fringe field effect, and has advantages of a small size and low energy consumption.

According to a first aspect, a capacitive sensor is provided. The capacitive sensor includes M plate pairs. In the M plate pairs, each plate pair includes a first plate and a second plate that are placed opposite to each other. M is a positive integer.

In addition, in each plate pair, a ratio of a plate length of each plate pair to a spacing in each plate pair is greater than 1 and less than or equal to 30.

It should be understood that, in each plate pair, the plate length may be a length of parts of plates that are opposite to each other in the plate pair, or may be a length of the first plate or the second plate that forms the plate pair.

For example, if the plate pair A includes the first plate and the second plate that are placed opposite to each other, the plate length of the plate pair A may be the length of parts of the first plate and the second plate that are opposite to each other. The plate length is less than or equal to the length of the first plate, and the plate length is also less than or equal to the length of the second plate.

In addition, the plate length of the plate pair A may also be directly defined as the length of the first plate or the second plate.

In addition, in each plate pair, the spacing between plates may be a distance between the first plate and the second plate in the plate pair.

In a plate pair, distances between different parts of a first plate and different parts of a second plate may be the same or different. When the distances between different parts of the first plate and different parts of the second plate in the plate pair are different, the spacing between plates may be any one of a minimum distance, a maximum distance, and an average distance between the first plate and the second plate in the plate pair.

The capacitive sensor in this application may also be referred to as a capacitor. For ease of unified description, the capacitive sensor is collectively referred to as a capacitive sensor herein.

In this application, the ratio of the plate length to the spacing between plates in the plate pair in the capacitive sensor is between 1 and 30, so that the capacitive sensor has strong fringe field effect, and may be further used to detect an air gesture of a user. In addition, the capacitive sensor has advantages of a small size and low energy consumption. Therefore, when the capacitive sensor is used in an electronic device, the air gesture of the user can be detected if occupied space is small and power consumption is low.

When the user makes an air gesture near the capacitive sensor, due to conductivity of human skin, when a hand of the user appears in an area in which a fringe field of the capacitive sensor is located, capacitance of the capacitive sensor changes. In addition, when the user makes different air gestures, capacitance of the capacitive sensor changes in different cases. Therefore, the air gesture of the user can be detected by using the capacitive sensor.

With reference to the first aspect, in some implementations of the first aspect, the ratio of the plate length of each plate pair to the spacing in each plate pair is greater than 1 and less than or equal to 15.

When the ratio of the plate length of each plate pair to the spacing in the plate pair in the capacitive sensor is greater than 1 and less than or equal to 15, the fringe field effect of the capacitive sensor is stronger, so that the capacitive sensor has higher sensitivity when detecting the air gesture of the user.

Optionally, in each plate pair, a ratio of an effective electrode length to the spacing between plates is greater than or equal to 8 and less than or equal to 12.

For an electrode pair, the effective electrode length may be a length of an overlapping portion between two electrodes that are disposed opposite to each other in the electrode pair.

When the ratio of the effective electrode length to the spacing between plates in each plate pair is between 8 and 12, the capacitive sensor can have proper capacitance, and a strong fringe field can be formed, so that the air gesture of the user can be better detected.

With reference to the first aspect, in some implementations of the first aspect, the first plate and the second plate in each plate pair are both made of a rectangular conductive material.

When the plate in each plate pair is in a rectangular shape, an area in which the plates of the plate pair in the capacitive sensor are opposite to each other can be increased when space is fixed, so that the capacitive sensor has a large capacitance value. When the user connects to a fringe field of the capacitive sensor by using different air gestures, the capacitance value of the capacitive sensor also obviously changes, which helps better detect the air gesture of the user.

With reference to the first aspect, in some implementations of the first aspect, the first plate and the second plate in each plate pair are both made of a cylindrical conductive material.

With reference to the first aspect, in some implementations of the first aspect, the first plate and the second plate in each plate pair are both made of a wavy conductive material.

When the plate in each plate pair is in a wavy shape, the plate length of the plate pair in the capacitive sensor can be increased (which is essentially equivalent to increasing an area in which the plates are opposite to each other) when space is fixed, so that the capacitive sensor has a large capacitance value. When the user connects to the fringe field of the capacitive sensor by using different air gestures, the capacitance value of the capacitive sensor also obviously changes, which helps better detect the air gesture of the user.

With reference to the first aspect, in some implementations of the first aspect, M is greater than 1. The M plate pairs each are formed by alternately arranging the first plate and the second plate.

When M is greater than 1, the capacitive sensor includes a plurality of plate pairs, and the capacitance value of the capacitive sensor can be increased, so that the capacitive sensor can be better used to detect the air gesture of the user (if the capacitance value is excessively small, it is usually difficult to detect the capacitance value, and then, M is set to a value greater than 1, so that the capacitive sensor can have a specific capacitance value, and a capacitance value change of the capacitive sensor can be detected).

With reference to the first aspect, in some implementations of the first aspect, the capacitive sensor further includes a first electrode and a second electrode. All first plates in the M plate pairs are connected to the first electrode. All second plates in the M plate pairs are connected to the second electrode.

The first electrode and the second electrode may connect the capacitive sensor to another module or unit. For example, when the capacitive sensor is disposed in the electronic device, the capacitive sensor may be connected to the electronic device by using the first electrode and the second electrode of the capacitive sensor.

When the capacitive sensor includes the M plate pairs, and further includes the first electrode and the second electrode, the capacitive sensor may be referred to as a double-comb capacitive sensor. By using the double-comb capacitive sensor, the capacitance value of the capacitive sensor and the fringe field effect of the capacitive sensor can be increased as much as possible in a case of limited space, to better detect the air gesture of the user subsequently.

With reference to the first aspect, in some implementations of the first aspect, M is less than or equal to 30.

When M is less than or equal to 30, the capacitive sensor can have a large capacitance value and strong capacitance field effect without occupying large space, so that the capacitive sensor is easy to be disposed in the electronic device to detect a gesture of the user.

With reference to the first aspect, in some implementations of the first aspect, the capacitive sensor is made of a flexible conductive material.

When the capacitive sensor is made of the flexible conductive material, it is easy to dispose or fasten the capacitive sensor in the electronic device.

The flexible conductive material may be a conductive material with good flexibility, for example, gold, silver, and graphene.

Optionally, the capacitive sensor is obtained through three-dimensional (3D) printing.

Optionally, the electrodes (the first electrode and the second electrode) and the plates (the first plate and the second plate) of the capacitive sensor are made of any one of gold, silver, and copper.

The capacitive sensor in the first aspect may be used in the electronic device. The electronic device may be a mobile terminal (such as a smartphone), a smartwatch, a smart band, a computer, a personal digital assistant, an in-vehicle multimedia device, an IoT device, a wearable device, or the like.

According to a second aspect, an electronic device is provided. The electronic device includes: a capacitive sensor, configured to detect an air gesture of a user and generate a detection signal based on fringe field effect; and a control unit, configured to recognize the air gesture of the user based on the detection signal, and control the electronic device to perform an operation matching the air gesture of the user.

The detection signal indicates a capacitance change of the capacitive sensor. Specifically, the detection signal may indicate a (real-time) change of a capacitance value of the capacitive sensor.

It should be understood that the foregoing control unit may keep an electrical connection to the capacitive sensor, so that the control unit can obtain the detection signal from the capacitive sensor, to recognize the air gesture of the user based on the detection signal.

Due to conductivity of human skin, when a hand of the user appears in an area in which a fringe field of the capacitive sensor is located, capacitance of the capacitive sensor changes. In addition, when the user makes different air gestures, capacitance of the capacitive sensor changes in different cases. Therefore, the air gesture of the user can be detected by using the capacitive sensor.

In this application, because the capacitive sensor is characterized by a small size and low energy consumption, and can detect the air gesture of the user based on the fringe field effect of the capacitive sensor, compared with a conventional electronic device, the electronic device in this application can reduce space occupied by the capacitive sensor in the electronic device and energy consumption generated by the capacitive sensor while detecting the air gesture of the user.

With reference to the second aspect, in some implementations of the second aspect, the control unit is configured to determine the air gesture of the user based on the detection signal and first correspondence information. The first correspondence information indicates air gestures corresponding to different detection signals.

Specifically, the control unit may determine, based on the first correspondence information, the air gesture corresponding to the detection signal, and determine that the air gesture corresponding to the detection signal is the air gesture of the user.

The first correspondence information may indicate correspondences between different detection signals and different air gestures. The first correspondence information may be manually determined.

The first correspondence information may be stored in the electronic device. When recognizing the air gesture of the user based on the detection signal, the electronic device may first obtain the first correspondence information, and then determine, based on the first correspondence information, the air gesture corresponding to the detection signal.

With reference to the second aspect, in some implementations of the second aspect, the control unit is configured to input the detection signal into a gesture recognition model for processing, to recognize the air gesture of the user.

The gesture recognition model is obtained through training based on training data. The training data includes a plurality of detection signals and air gestures corresponding to the plurality of detection signals.

The gesture recognition model may be a neural network model.

For example, the gesture recognition model may be implemented by using a simple neural network model (for example, a simple regression model), or may be implemented by using a complex neural network model (for example, a neural network with a large quantity of layers and a complex network connection relationship).

The gesture recognition model may include the first correspondence information. When the detection signal is input into the gesture recognition model for processing, the gesture recognition model can determine, based on the first correspondence information, the air gesture corresponding to the detection signal, to recognize the air gesture of the user (the air gesture corresponding to the detection signal is the recognized air gesture of the user).

With reference to the second aspect, in some implementations of the second aspect, before the control unit controls the electronic device to perform the operation matching the air gesture of the user, the control unit is further configured to determine that the electronic device works in an air operation mode.

The air operation mode may also be referred to as a mid-air gesture recognition control mode, a mid-air gesture, a mid-air control mode, or the like.

Specifically, after determining that the electronic device works in the air operation mode, the control unit controls the electronic device to perform the operation matching the air gesture of the user, so that a misoperation or a false response of the electronic device can be avoided.

With reference to the second aspect, in some implementations of the second aspect, the control unit is configured to: when the air gesture of the user is a first air gesture, determine that the electronic device works in the air operation mode.

The first air gesture is an operation gesture that triggers the electronic device to work in the air operation mode.

Optionally, the control unit is further configured to: when the air gesture of the user is another air gesture other than the first air gesture, determine that the electronic device works in a non-air operation mode.

Optionally, the control unit is further configured to determine whether the air gesture of the user is the first air gesture.

The first air gesture may be one gesture, or may be a plurality of gestures. When the first air gesture includes a plurality of gestures, provided that the user makes any one of the plurality of gestures, it may be considered that the user makes the first air gesture.

The first air gesture may be a preset specific operation gesture.

The first air gesture may be specifically a gesture such as a left-slide gesture, a right-slide gesture, a flip-up gesture, a flip-down gesture, or a confirmation gesture.

In other words, after determining the air gesture of the user based on the detection signal, the control unit may determine whether the air gesture of the user is the first air gesture. When the air gesture of the user is the first air gesture, it is determined that the electronic device works in the air operation mode. When the air gesture of the user is another air gesture other than the first air gesture, it is determined that the electronic device works in the non-air operation mode.

When the electronic device works in the non-air operation mode, the control unit does not control the electronic device to perform the operation matching the air gesture of the user. In this case, the user may input an operation signal to the electronic device in another manner (for example, a key operation or a touch operation), and then the control unit controls the electronic device based on the operation signal input by the user.

With reference to the second aspect, in some implementations of the second aspect, when the electronic device is in the air operation mode, the control unit is further configured to: when the air gesture of the user is a second air gesture, switch a working mode of the electronic device from the air operation mode to the non-air operation mode.

The second air gesture may be an air gesture that enables the electronic device to exit the air operation mode. The user can flexibly control, by using the second air gesture, the electronic device to switch from the air operation mode to the non-air operation mode, thereby implementing flexible switching of the working mode of the electronic device.

With reference to the second aspect, in some implementations of the second aspect, the control unit is configured to: when an air operation mode switch of the electronic device is in an on state, determine that the electronic device works in the air operation mode.

Optionally, the control unit is further configured to: when an air operation mode switch of the electronic device is in an off state, determine that the electronic device works in the non-air operation mode.

The air operation mode switch may be a mechanical switch or an electronic switch.

When the air operation mode switch is the mechanical switch, the air operation mode switch may be a button or a key, and the user may set, by operating the button or the key, whether the electronic device works in the air operation mode. In this case, the control unit may determine, by detecting a status of a corresponding button or switch, whether the electronic device works in the air operation mode.

When the air operation mode switch is the electronic switch, the user may set, in a manner of setting state information of the electronic device by performing the touch operation, whether the electronic device works in the air operation mode. In this case, the control unit may determine, by detecting the state information of the electronic device, whether the electronic device works in the air operation mode.

It should be understood that, when the air operation mode switch of the electronic device is in the off state, the control unit does not control the electronic device to perform the operation matching the air gesture of the user. Further, the control unit does not recognize the air gesture of the user based on the detection signal. Further, the capacitive sensor does not detect the air gesture of the user and generate the detection signal based on the fringe field effect.

With reference to the second aspect, in some implementations of the second aspect, the control unit is configured to: when a posture of the electronic device is a first posture, determine that the electronic device works in the air operation mode.

The first posture is a posture that triggers the electronic device to work in the air operation mode.

Optionally, the control unit is further configured to: when the posture of the electronic device is another posture other than the first posture, determine that the electronic device works in the air operation mode.

Optionally, the control unit is further configured to determine whether the posture of the electronic device is the first posture.

The first posture may be a preset specific posture.

The first posture may be one posture, or may be a plurality of postures. When the first posture includes a plurality of postures, provided that the electronic device is in any one of the plurality of postures, it may be considered that the electronic device is in the first posture.

In other words, the control unit may determine whether the electronic device works in the first posture. When the electronic device is in the first posture, the control unit determines that the electronic device works in the air operation mode. When the electronic device is in a second posture, the control unit determines that the electronic device works in the non-air operation mode.

When the electronic device works in the non-air operation mode, the control unit does not control the electronic device to perform the operation matching the air gesture of the user. In this case, the user may input an operation signal to the electronic device in another manner (for example, a key operation or a touch operation), and then the control unit controls the electronic device based on the operation signal input by the user.

The first posture may include horizontal placement and vertical placement. The electronic device being in the first posture may mean that the electronic device is in a horizontal placement state or a vertical placement state.

The posture of the electronic device may be determined based on information detected by a gyroscope.

Optionally, the control unit is further configured to: when a distance between the user and the capacitive sensor is less than or equal to a preset distance and duration is greater than or equal to a preset period of time, determine that the electronic device works in the air operation mode.

Optionally, the control unit is further configured to: when a distance between the user and the capacitive sensor is greater than a preset distance, determine that the electronic device works in the non-air operation mode.

Optionally, the control unit is further configured to: when a distance between the user and the capacitive sensor is less than a preset distance and duration is less than a preset period of time, determine that the electronic device works in the non-air operation mode.

Optionally, the control unit is configured to determine the distance between the user and the capacitive sensor and the duration in which the user approaches the capacitive sensor.

In the electronic device, the distance between the user and the capacitive sensor may be determined by using a distance sensor. The control unit may obtain information about the distance between the user and the capacitive sensor from the distance sensor.

With reference to the second aspect, in some implementations of the second aspect, the capacitive sensor includes M plate pairs, and each of the M plate pairs includes a first plate and a second plate that are placed opposite to each other.

In each plate pair, a ratio of a plate length of each plate pair to a spacing in each plate pair is greater than 1 and less than or equal to 30. M is a positive integer.

In each plate pair, the plate length may be a length of parts of plates that are opposite to each other in the plate pair, or may be a length of the first plate or the second plate that forms the plate pair.

With reference to the second aspect, in some implementations of the second aspect, the first plate and the second plate in each plate pair are both made of a wavy conductive material.

In this application, the ratio of the plate length to the spacing between plates in the plate pair in the capacitive sensor is between 1 and 30, so that the capacitive sensor has strong fringe field effect. Therefore, the air gesture of the user can be better detected by placing the capacitive sensor in the electronic device.

With reference to the second aspect, in some implementations of the second aspect, the ratio of the plate length of each plate pair to the spacing in each plate pair is greater than 1 and less than or equal to 15.

When the ratio of the plate length of each plate pair to the spacing in the plate pair in the capacitive sensor is greater than 1 and less than or equal to 15, the fringe field effect of the capacitive sensor is stronger, so that the capacitive sensor has higher sensitivity when detecting the air gesture of the user.

With reference to the second aspect, in some implementations of the second aspect, the first plate and the second plate in each plate pair are both made of any one of a rectangular conductive material, a cylindrical conductive material, and a wavy conductive material.

When the plate in each plate pair is in a rectangular shape, an area in which the plates of the plate pair in the capacitive sensor are opposite to each other can be increased when space is fixed, so that the capacitive sensor has a large capacitance value. When the user connects to the fringe field of the capacitive sensor by using different air gestures, the capacitance value of the capacitive sensor also obviously changes, which helps better detect the air gesture of the user.

When the plate in each plate pair in the capacitive sensor is in a wavy shape, the plate length of the plate pair in the capacitive sensor can be increased (which is essentially equivalent to increasing an area in which the plates are opposite to each other) when space is fixed, so that the capacitive sensor has a large capacitance value. When the user connects to the fringe field of the capacitive sensor by using different air gestures, the capacitance value of the capacitive sensor also obviously changes, which helps better detect the air gesture of the user.

With reference to the second aspect, in some implementations of the second aspect, M is greater than 1. The M plate pairs each are formed by alternately arranging the first plate and the second plate.

When M is greater than 1, the capacitive sensor includes a plurality of plate pairs, and the capacitance value of the capacitive sensor can be increased, so that the electronic device can better detect the air gesture of the user by using the capacitive sensor.

Generally, if the capacitance value of the capacitive sensor is excessively small, it is difficult to detect the capacitance value. Then, M is set to a value greater than 1, so that the capacitive sensor can have a specific capacitance value, thereby facilitating detection of a capacitance value change of the capacitive sensor.

With reference to the second aspect, in some implementations of the second aspect, the capacitive sensor further includes a first electrode and a second electrode. All first plates in the M plate pairs are connected to the first electrode. All second plates in the M plate pairs are connected to the second electrode.

The first electrode and the second electrode may connect the capacitive sensor to the control unit.

When the capacitive sensor includes the M plate pairs, and further includes the first electrode and the second electrode, the capacitive sensor may be referred to as a double-comb capacitive sensor. By using the double-comb capacitive sensor, the capacitance value of the capacitive sensor and the fringe field effect of the capacitive sensor can be increased as much as possible in a case of limited space, to better detect the air gesture of the user subsequently.

With reference to the second aspect, in some implementations of the second aspect, M is less than or equal to 30.

When M is less than or equal to 30, the capacitive sensor can have a large capacitance value and strong capacitance field effect without occupying large space, so that the capacitive sensor is easy to be disposed in the electronic device to detect a gesture of the user.

With reference to the second aspect, in some implementations of the second aspect, the capacitive sensor is made of a flexible conductive material.

When the capacitive sensor is made of the flexible conductive material, it is easy to dispose or fasten the capacitive sensor in the electronic device.

Optionally, the electrodes (the first electrode and the second electrode) and the plates (the first plate and the second plate) of the capacitive sensor are made of any one of gold, silver, and copper.

With reference to the second aspect, in some implementations of the second aspect, the capacitive sensor is disposed on a surface of the electronic device in a 3D printing manner.

The capacitive sensor is disposed on the surface of the electronic device in the 3D printing manner, so that complexity of installing the capacitive sensor in the electronic device can be reduced, and a technological process can be simplified.

Optionally, in each plate pair, a ratio of an effective electrode length to the spacing between plates is greater than or equal to 8 and less than or equal to 12.

For an electrode pair, the effective electrode length may be a length of an overlapping portion between two electrodes that are disposed opposite to each other in the electrode pair.

When the ratio of the effective electrode length to the spacing between plates in each plate pair is between 8 and 12, the capacitive sensor can have proper capacitance, and a strong fringe field can be formed, so that the air gesture of the user can be better detected.

The electronic device in the second aspect may be a mobile terminal (such as a smartphone), a smartwatch, a smart band, a computer, a personal digital assistant, an in-vehicle multimedia device, an IoT device, a wearable device, or the like.

According to a third aspect, an electronic device control method is provided. The control method includes: obtaining a detection signal of a capacitive sensor; recognizing an air gesture of a user based on the detection signal; and controlling an electronic device to perform an operation matching the air gesture of the user.

The detection signal is a signal generated based on fringe field effect when the capacitive sensor detects the air gesture of the user. The detection signal indicates a capacitance change of the capacitive sensor. Specifically, the detection signal may indicate a (real-time) change of a capacitance value of the capacitive sensor.

The foregoing control method may be performed by the electronic device. Specifically, the foregoing control method may be performed by a control unit in the electronic device. The capacitive sensor may be disposed on the electronic device. The foregoing control unit may keep an electrical connection to the capacitive sensor, so that the control unit can obtain the detection signal from the capacitive sensor, to recognize the air gesture of the user based on the detection signal.

Due to conductivity of human skin, when a hand of the user appears in an area in which a fringe field of the capacitive sensor is located, capacitance of the capacitive sensor changes. In addition, when the user makes different air gestures, capacitance of the capacitive sensor changes in different cases. Therefore, the air gesture of the user can be detected by using the capacitive sensor.

In this application, because the capacitive sensor is characterized by a small size and low energy consumption, and can detect the air gesture of the user based on the fringe field effect of the capacitive sensor, compared with a conventional electronic device control method, the control method in this application can reduce space occupied by the capacitive sensor in the electronic device and energy consumption generated by the capacitive sensor while detecting the air gesture of the user.

With reference to the third aspect, in some implementations of the third aspect, the recognizing an air gesture of a user based on the detection signal includes: determining the air gesture of the user based on the detection signal and first correspondence information.

The first correspondence information indicates air gestures corresponding to different detection signals.

Specifically, when the air gesture of the user is recognized, the air gesture corresponding to the detection signal may be determined based on the first correspondence information, and the air gesture corresponding to the detection signal is determined as the air gesture of the user.

The first correspondence information may indicate correspondences between different detection signals and different air gestures. The first correspondence information may be manually determined.

The first correspondence information may be stored in the electronic device. When recognizing the air gesture of the user based on the detection signal, the electronic device may first obtain the first correspondence information, and then determine, based on the first correspondence information, the air gesture corresponding to the detection signal.

With reference to the third aspect, in some implementations of the third aspect, the recognizing an air gesture of a user based on the detection signal includes: inputting the detection signal into a gesture recognition model for processing, to recognize the air gesture of the user.

The gesture recognition model is obtained through training based on training data. The training data includes a plurality of detection signals and air gestures corresponding to the plurality of detection signals.

The gesture recognition model may include the first correspondence information. When the detection signal is input into the gesture recognition model for processing, the gesture recognition model can determine, based on the first correspondence information, the air gesture corresponding to the detection signal, to recognize the air gesture of the user (the air gesture corresponding to the detection signal is the recognized air gesture of the user).

With reference to the third aspect, in some implementations of the third aspect, before the controlling an electronic device to perform an operation matching the air gesture of the user, the control method further includes: determining that the electronic device works in an air operation mode.

In this application, after determining that the electronic device works in the air operation mode, the control unit controls the electronic device to perform the operation matching the air gesture of the user, so that a misoperation or a false response of the electronic device can be avoided.

With reference to the third aspect, in some implementations of the third aspect, the determining that the electronic device works in an air operation mode includes: when the air gesture of the user is a first air gesture, determining that the electronic device works in the air operation mode.

The first air gesture is an operation gesture that triggers the electronic device to work in the air operation mode.

Optionally, the determining that the electronic device works in an air operation mode includes: when the air gesture of the user is another air gesture other than the first air gesture, determining that the electronic device works in a non-air operation mode.

Optionally, the determining that the electronic device works in an air operation mode includes: determining whether the air gesture of the user is a first air gesture.

The first air gesture may be one gesture, or may be a plurality of gestures. When the first air gesture includes a plurality of gestures, provided that the user makes any one of the plurality of gestures, it may be considered that the user makes the first air gesture.

The first air gesture may be a preset specific operation gesture.

The first air gesture may be specifically a gesture such as a left-slide gesture, a right-slide gesture, a flip-up gesture, a flip-down gesture, or a confirmation gesture.

In other words, in the foregoing process, after the air gesture of the user is determined based on the detection signal, it may be determined whether the air gesture of the user is the first air gesture. When the air gesture of the user is the first air gesture, it is determined that the electronic device works in the air operation mode. When the air gesture of the user is another air gesture other than the first air gesture, it is determined that the electronic device works in the non-air operation mode.

In the foregoing control method, when the electronic device works in the non-air operation mode, the electronic device is not controlled to perform the operation matching the air gesture of the user. In this case, the user may input an operation signal to the electronic device in another manner (for example, a key operation or a touch operation), and then the control unit controls the electronic device based on the operation signal input by the user.

The capacitive sensor may always detect the air gesture of the user, to generate the detection signal. In the foregoing control method, the detection signal may be always obtained from the capacitive sensor, and the air gesture of the user is determined based on the detection signal. However, whether the electronic device is controlled to perform the operation matching the air gesture of the user depends on whether the electronic device works in the air operation mode.

With reference to the third aspect, in some implementations of the third aspect, the determining that the electronic device works in an air operation mode includes: when an air operation mode switch of the electronic device is in an on state, determining that the electronic device works in the air operation mode.

Optionally, the method further includes: when an air operation mode switch of the electronic device is in an off state, determining that the electronic device works in the non-air operation mode.

The air operation mode switch may be a mechanical switch or an electronic switch.

When the air operation mode switch is the mechanical switch, the air operation mode switch may be a button or a key, and the user may set, by operating the button or the key, whether the electronic device works in the air operation mode. In this case, whether the electronic device works in the air operation mode may be determined by detecting a status of a corresponding button or switch.

When the air operation mode is the electronic switch, the user may set, in a manner of setting state information of the electronic device by performing the touch operation, whether the electronic device works in the air operation mode. In this case, whether the electronic device works in the air operation mode may be determined by detecting the state information of the electronic device.

It should be understood that, when the air operation mode switch of the electronic device is in the off state, the electronic device is not controlled to perform the operation matching the air gesture of the user in the foregoing control method. Further, in the foregoing control method, the air gesture of the user is not recognized based on the detection signal. Further, the capacitive sensor does not detect the air gesture of the user and generate the detection signal based on the fringe field effect.

With reference to the third aspect, in some implementations of the third aspect, the determining that the electronic device works in an air operation mode includes: when a posture of the electronic device is a first posture, determining that the electronic device works in the air operation mode.

The first posture is a posture that triggers the electronic device to work in the air operation mode.

Optionally, the method further includes: when the posture of the electronic device is another posture other than the first posture, determining that the electronic device works in the air operation mode.

Optionally, the method further includes: determining whether the posture of the electronic device is the first posture.

The first posture may be a preset specific posture.

The first posture may be one posture, or may be a plurality of postures. When the first posture includes a plurality of postures, provided that the electronic device is in any one of the plurality of posture gestures, it may be considered that the electronic device is in the first posture.

In other words, a working mode of the electronic device is related to the posture of the electronic device. When the electronic device is in the first posture, it may be determined that the electronic device works in the air operation mode. When the electronic device is in the second posture, it may be determined that the electronic device works in the non-air operation mode.

When the electronic device works in the non-air operation mode, the electronic device is not controlled to perform the operation matching the air gesture of the user in the foregoing control method. In this case, the user may input an operation signal to the electronic device in another manner (for example, a key operation or a touch operation). In the foregoing control method, the electronic device may be controlled based on the operation signal input by the user.

The first posture may include horizontal placement and vertical placement. The electronic device being in the first posture may mean that the electronic device is in a horizontal placement state or a vertical placement state.

The posture of the electronic device may be determined based on information detected by a gyroscope.

Optionally, the determining that the electronic device works in an air operation mode includes: when a distance between the user and the capacitive sensor is less than or equal to a preset distance and duration is greater than or equal to a preset period of time, determining that the electronic device works in the air operation mode.

Optionally, the method further includes: when a distance between the user and the capacitive sensor is greater than a preset distance, determining that the electronic device works in the non-air operation mode.

Optionally, the method further includes: when a distance between the user and the capacitive sensor is less than a preset distance and duration is less than a preset period of time, determining that the electronic device works in the non-air operation mode.

Optionally, the method further includes: determining the distance between the user and the capacitive sensor and the duration in which the user approaches the capacitive sensor.

According to a fourth aspect, an electronic device is provided. The electronic device includes: a capacitive sensor and a processor. The capacitive sensor is configured to detect an air gesture of a user and generate a detection signal based on fringe field effect. The processor is configured to recognize the air gesture of the user based on the detection signal and control the electronic device to perform an operation matching the air gesture of the user.

The detection signal may indicate a capacitance change of the capacitive sensor.

The processor may be a module or a unit having a data processing function in the electronic device. Specifically, the processor may be a central processing unit (CPU) or an integrated circuit (IC) having a data processing function.

In this application, because the capacitive sensor is characterized by a small size and low energy consumption, and can detect the air gesture of the user based on the fringe field effect of the capacitive sensor, compared with a conventional electronic device, the electronic device in this application can reduce space occupied by the capacitive sensor in the electronic device and energy consumption generated by the capacitive sensor while detecting the air gesture of the user.

The electronic device in the fourth aspect may be a mobile terminal (such as a smartphone), a smartwatch, a smart band, a computer, a personal digital assistant, an in-vehicle multimedia device, an IoT device, a wearable device, or the like.

The processor in the fourth aspect is equivalent to the control unit in the third aspect. The processor in the fourth aspect can implement a same function as the control unit in the third aspect.

According to a fifth aspect, a computer program product including instructions is provided. When the computer program product runs on a computer, the computer is enabled to perform the method according to the third aspect.

According to a sixth aspect, a chip is provided. The chip includes a processor and a data interface. The processor reads, through the data interface, instructions stored in a memory, to perform the method according to the third aspect.

BRIEF DESCRIPTION OF DRAWINGS

FIG. 23 is a schematic diagram of a processing process of a processor.

DESCRIPTION OF EMBODIMENTS

The following describes technical solutions of this application with reference to accompanying drawings.

In a conventional gesture recognition solution, in some cases, gesture recognition can be implemented only by using a chip having a complex computing capability, resulting in high energy consumption of the chip. In some cases, gesture recognition can be implemented only by using a sensor having a large size, and large space needs to be occupied.

To resolve problems that a sensor needs to occupy large space and generated energy consumption is high in the conventional gesture recognition solution, this application provides a novel capacitive sensor. When a user makes different air gestures near the capacitive sensor, due to intervention of a hand of the user, capacitance of the capacitive sensor correspondingly changes due to impact of fringe field effect. Therefore, after a capacitance value change of the capacitive sensor is obtained, the air gesture of the user may be determined based on a correspondence between the capacitance change of the capacitive sensor and the air gesture of the user. Because the capacitive sensor may be generally manufactured in a small size, a small amount of power is consumed. Therefore, the capacitive sensor provided in this application can detect the air gesture of the user, and has advantages of a small size and low energy consumption. When the capacitive sensor is deposed on an electronic device, space occupied by the electronic device can be reduced, and power consumption of the electronic device can be reduced.

Figure 1:
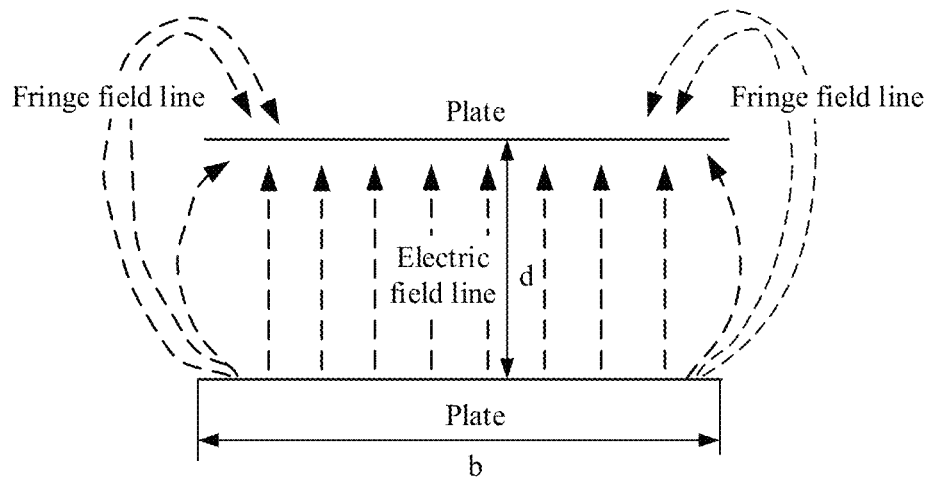
FIG. 1 is a schematic diagram of an electric field line and a fringe field line of a capacitor.

FIG. 1 is a schematic diagram of an electric field line and a fringe field line of a capacitor.

FIG. 1 shows the electric field line and the fringe field line of the capacitor (the fringe field line may be considered as a special electric field line, and the electric field line is located at an edge of the capacitor). Due to conductivity of human skin, when a hand of a human body connects to the fringe field line of the capacitor, a new capacitor is formed, and an originally distributed electric field of the capacitor changes. As a result, the capacitance of the capacitor changes. When the user connects to a fringe field of the capacitor by using different air gestures, a capacitance value of the capacitor changes in different cases. Therefore, the air gesture of the user may be determined by using the correspondence between the capacitance change and the air gesture of the user, so that the air gesture of the user can be detected by using the capacitance.

For the capacitor shown in FIG. 1, if only the electric field line is considered and the fringe field line is not considered, a standard capacitance value of the capacitor is $$C = \varepsilon \frac{b}{d}.$$

b is a plate length of the capacitor, d is a spacing between plates of the capacitor, and ε is a dielectric constant of a medium between two plates of the capacitor.

If the fringe field line is considered, a total capacitance value of the capacitor in FIG. 1 is shown in formula (1).

$$C_H = \varepsilon \frac{b}{d} + \frac{\varepsilon}{\pi}\left[1 + \ln\left(1 + \frac{2\pi b}{d} + \ln\left(1 + \frac{2\pi b}{d}\right)\right)\right] \quad (1)$$

As shown in formula (1), if the fringe field of the capacitor is affected, the capacitance value of the capacitor also changes. Therefore, the air gesture of the user may be detected based on the capacitance value change of the capacitor.

The following describes in detail the capacitive sensor in this embodiment of this application with reference to the accompanying drawings.

Figure 2:
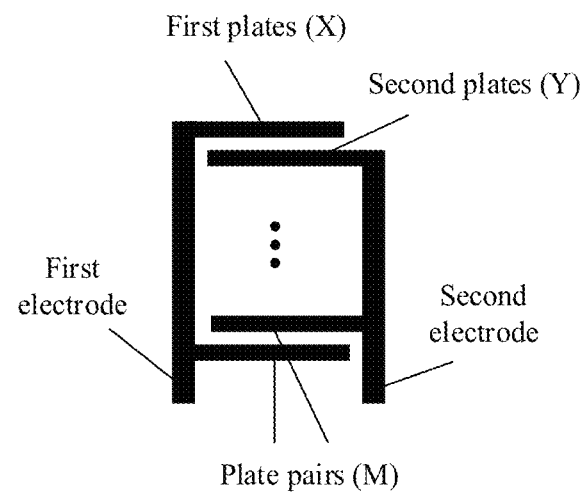
FIG. 2 is a schematic diagram of a structure of a capacitive sensor according to an embodiment of this application.

FIG. 2 is a schematic diagram of a structure of a capacitive sensor according to an embodiment of this application.

As shown in FIG. 2, the capacitive sensor includes M plate pairs. In the M plate pairs, each plate pair includes a first plate and a second plate that are placed opposite to each other. M is a positive integer. The capacitive sensor in this application may include only one plate pair, or may include a plurality of plate pairs.

In addition, in each of the M plate pairs, a ratio of a plate length (a plate length in the plate pair) to a spacing between plates (a distance between two plates in the plate pair) is greater than 1 and less than or equal to 30.

The capacitive sensor in this application may also be referred to as a capacitor. For ease of unified description, the capacitive sensor is collectively referred to as a capacitive sensor herein.

Figure 3:
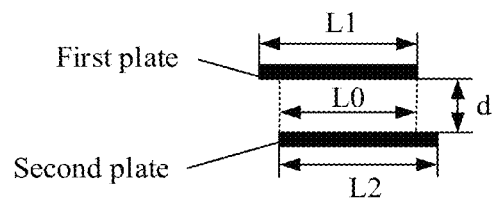
FIG. 3 is a schematic diagram of dimensions of a plate pair.

The following describes the plate length and the spacing between plates in the plate pair in detail with reference to FIG. 3.

FIG. 3 is a schematic diagram of dimensions of the plate pair.

As shown in FIG. 3, the first plate and the second plate both form a plate pair A. Therefore, the plate length of the plate pair A may be a length of parts of the first plate and the second plate that are opposite to each other. In this case, the plate length of the plate pair A may be represented by L0. The plate length of the plate pair A in FIG. 3 may also be represented by a length of the first plate or the second plate. For example, as shown in FIG. 3, the plate length of the plate pair A may be represented by L1 or L2. The spacing between plates in the plate pair A in FIG. 3 may be a distance between the first plate and the second plate. As shown in FIG. 3, the spacing between the plates in the plate pair A may be represented by d.

It should be understood that FIG. 3 shows only a case in which the distances between two plates in the plate pairs are equal. In some cases, spacings between plates at different positions in the plate pairs may be different. For example, in a plate pair, a spacing between edge parts of the plates is greater than a spacing between middle parts of the plates. In this case, a spacing between plates in a plate pair may be any one of a minimum distance, a maximum distance and an average distance between the first plate and the second plate in the plate pair.

In addition, as shown in FIG. 3, a plate pair may include a first electrode and a second electrode. A length of the first plate of the plate pair is L, a spacing between plates in the plate pair is d, and L/D may represent a ratio of the plate length to the spacing between plates in the plate pair.

In this application, the ratio of the plate length to the spacing between plates in the plate pair in the capacitive sensor is between 1 and 30, so that the capacitive sensor has strong fringe field effect, and may be further used to detect an air gesture of a user. In addition, the capacitive sensor has advantages of a small size and low energy consumption. Therefore, when the capacitive sensor is used in an electronic device, the air gesture of the user can be detected if occupied space is small and power consumption is low.

Specifically, based on theoretical deduction and actual tests, it is found that the ratio of the plate length to the spacing between plates in each plate pair is inversely proportional to strength of the fringe field effect. A smaller ratio of the plate length to the spacing between plates in each plate pair indicates stronger fringe field effect of the capacitive sensor. In addition, because a capacitance value of the capacitive sensor also affects detection of the air gesture of the user to some extent, when the ratio of the plate length to the spacing between plates in each plate pair in the capacitive sensor is between 1 and 30, the capacitive sensor can better detect the air gesture of the user.

Impact of the ratio of the plate length to the spacing between plates of a single capacitor on a fringe field is described in detail below with reference to a formula and FIG. 4.

$$\delta_H = \frac{|C_{i1} - C_H|}{C_{i1}} \times 100\% = \frac{d}{\pi b}\left\{1 + \ln\left[1 + \frac{2\pi b}{d} + \ln\left(1 + \frac{2\pi b}{d}\right)\right]\right\} \quad (2)$$

In the foregoing formula (2), $C_H$ represents a total capacitance value of a single-capacitor sensor, $C_{i1}$ represents a standard capacitance value of a single capacitor (a fringe field line is not considered), $\delta_H$ represents a difference between $C_H$ and $C_{i1}$, and a smaller value of $\delta_H$ indicates weaker fringe field effect of the capacitor.

Figure 4:
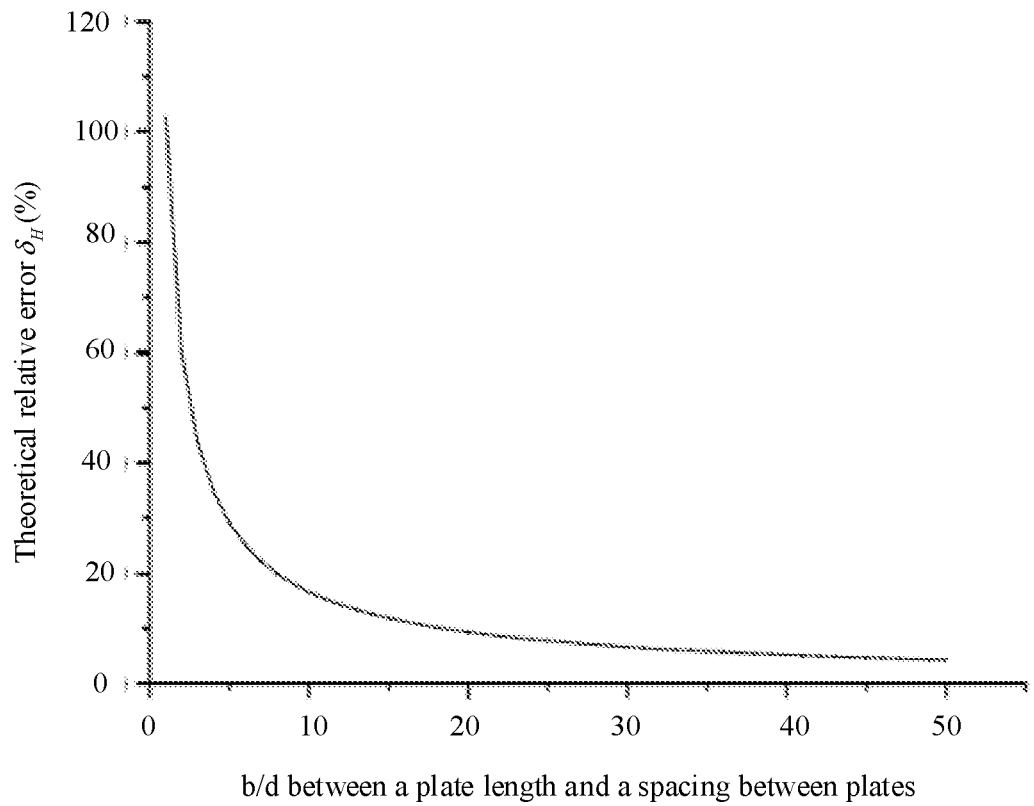
FIG. 4 is a schematic diagram of a relationship between fringe field effect and a ratio of a plate length to a spacing between plates of a capacitive sensor.

A relationship between $\delta_H$ and b/d is shown in FIG. 4. In FIG. 4, a larger value of b/d indicates a smaller value of $\delta_H$ and weaker fringe field effect of the capacitor.

When the user makes an air gesture near the capacitive sensor, due to conductivity of human skin, when a hand of the user appears in an area in which a fringe field of the capacitive sensor is located, capacitance of the capacitive sensor changes. In addition, when the user makes different air gestures, capacitance of the capacitive sensor changes in different cases. Therefore, the air gesture of the user can be detected by using the capacitive sensor.

To further enhance the fringe field effect of the capacitive sensor in this embodiment of this application, the ratio of the plate length to the spacing between plates in each plate pair in the capacitive sensor may be set to be smaller.

Specifically, in the capacitive sensor in this embodiment of this application, a ratio of the plate length of each plate pair to a spacing in each plate pair of the M plate pairs may be greater than 1 and less than or equal to 15.

When the ratio of the plate length of each plate pair to the spacing in the plate pair in the capacitive sensor is greater than 1 and less than or equal to 15, the fringe field effect of the capacitive sensor is stronger, so that the capacitive sensor has higher sensitivity when detecting the air gesture of the user.

For the foregoing capacitive sensor, when M=1, the capacitive sensor may include only one plate pair. When M is greater than 1, the capacitive sensor may include a plurality of plate pairs. In this case, the M plate pairs each may be formed by alternately arranging the first plate and the second plate.

As shown in FIG. 2, when M is greater than 1, the M plate pairs each may be formed by alternately arranging X first plates and Y second plates.

It should be understood that, when the X first plates and the Y second plates are alternately arranged to form the M plate pairs, the first plates or the second plates may be reused, to form as many plate pairs as possible when a quantity of plates is limited.

Figure 5:
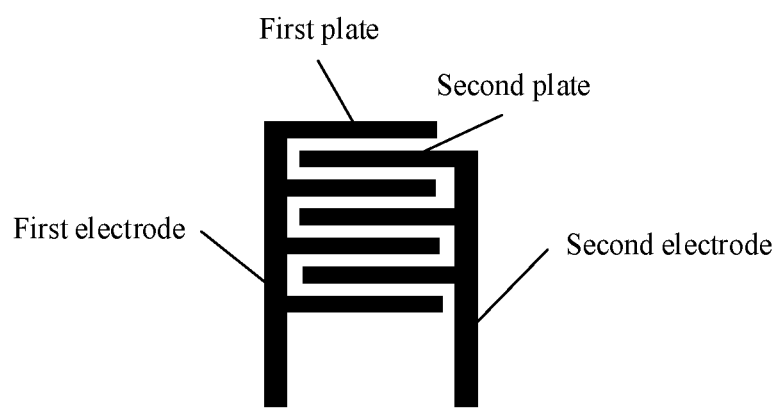
FIG. 5 is a schematic diagram of a structure of a capacitive sensor according to an embodiment of this application.

FIG. 5 is a schematic diagram of a structure of the capacitive sensor according to an embodiment of this application.

As shown in FIG. 5, the capacitive sensor includes four first plates and three second plates. The four first plates are connected to the first electrode. The three second plates are connected to the second electrode. In FIG. 5, six plate pairs are formed between the four first plates and the three second plates. In FIG. 5, the second plate located between two first plates may not only form a plate pair with the upper first plate, but also form a plate pair with the lower first plate.

In this application, the first plate and the second plate in the middle are reused, so that more plate pairs may be formed when the quantity of the plates is limited. Therefore, the capacitive sensor has a higher capacitance value and a stronger fringe field effect. In this way, when the user connects to the fringe field of the capacitive sensor by using different air gestures, the capacitance value of the capacitive sensor obviously changes, and different air gestures of the user can be detected more accurately.

In this application, when M is greater than 1, the capacitive sensor includes a plurality of plate pairs, and the capacitance value of the capacitive sensor can be increased, so that the capacitive sensor can better detect the air gesture of the user.

Generally, if the capacitance value of the capacitive sensor is excessively small, it is difficult to detect the capacitance value. Then, M is set to a value greater than 1, so that the capacitive sensor can have a specific capacitance value, thereby facilitating detection of a capacitance value change of the capacitive sensor.

Specifically, in this application, when the capacitive sensor includes the plurality of plate pairs, the capacitive sensor may have strong fringe field distribution through appropriate parameter design. When the hand of the user intervenes in the fringe field of the capacitive sensor, the capacitance value of the capacitive sensor changes due to impact of coupling capacitance. In view of this, a human gesture may be detected. Because the capacitive sensor is simple in structure (mainly formed by cascading a plurality of plate pairs), and low in power consumption, the capacitive sensor in this application can detect the air gesture of the user if occupied space is small and power consumption is low.

Optionally, in an embodiment, the capacitive sensor further includes a first electrode and a second electrode. All first plates in the M plate pairs are connected to the first electrode. All second plates in the M plate pairs are connected to the second electrode.

The first electrode and the second electrode may connect the capacitive sensor to another module or unit. For example, when the capacitive sensor is disposed in the electronic device, the capacitive sensor may be connected to the electronic device by using the first electrode and the second electrode of the capacitive sensor.

When the capacitive sensor includes M plate pairs, and further includes the first electrode and the second electrode, the capacitive sensor may be referred to as a double-comb capacitive sensor (in this case, the plate pair may be referred to as a comb pair). By using the double-comb capacitive sensor, the capacitance value of the capacitive sensor and the fringe field effect of the capacitive sensor can be increased as much as possible in a case of limited space, to better detect the air gesture of the user subsequently.

Optionally, the first plate and the second plate in each of the M plate pairs are both made of a conductive material. The first plate and the second plate may have a plurality of specific shapes. Specifically, the first plate and the second plate may be any one of a rectangular shape, a cylindrical shape, and a wavy shape.

Figure 8:
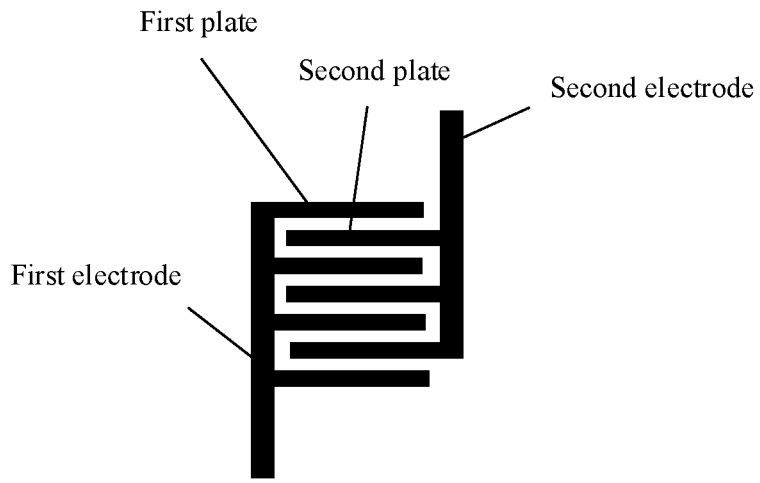
FIG. 8 is a schematic diagram of a structure of a capacitive sensor according to an embodiment of this application.

For example, in the capacitive sensors shown in FIG. 2, FIG. 5, and FIG. 8, the first plate and the second plate in each plate pair are made of a rectangular conductive material.

Figure 6:
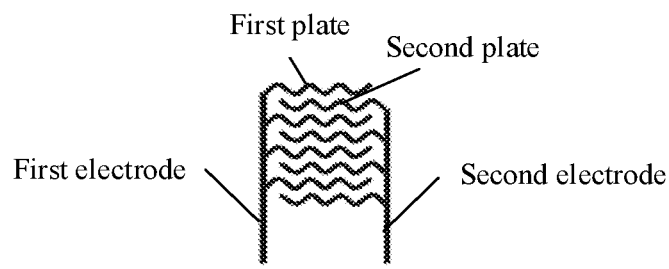
FIG. 6 is a schematic diagram of a structure of a capacitive sensor according to an embodiment of this application.

FIG. 6 is a schematic diagram of a structure of the capacitive sensor according to an embodiment of this application.

In the capacitive sensor shown in FIG. 6, the first plate and the second plate are both made of a wavy conductive material.

When the plate in each plate pair is in a rectangular shape, an area in which the plates of the plate pair in the capacitive sensor are opposite to each other can be increased when space is fixed, so that the capacitive sensor has a large capacitance value. When the user connects to the fringe field of the capacitive sensor by using different air gestures, the capacitance value of the capacitive sensor also obviously changes, which helps better detect the air gesture of the user.

When the plate in each plate pair is in a wavy shape, the plate length of the plate pair in the capacitive sensor can be increased (which is essentially equivalent to increasing an area in which the plates are opposite to each other) when space is fixed, so that the capacitive sensor has a large capacitance value. When the user connects to the fringe field of the capacitive sensor by using different air gestures, the capacitance value of the capacitive sensor also obviously changes, which helps better detect the air gesture of the user.

It should be understood that a larger value of M is not preferred. The larger value of M indicates more space occupied by the capacitive sensor. Therefore, M may be set within a specific range, so that the capacitive sensor occupies less space.

Optionally, M is less than or equal to 30.

When M is less than or equal to 30, the capacitive sensor can have a large capacitance value and strong capacitance field effect without occupying large space, so that the capacitive sensor is easy to be disposed in the electronic device to detect a gesture of the user.

The value of M also affects the fringe field effect to some extent. The following provides detailed description with reference to FIG. 7.

$$\delta_H = \frac{|C_i - C_{e0}|}{C_i} = \frac{d_1 d_2}{\pi b(n d_2 + (n-1) d_1)} \left[ 1 + \ln\left(1 + \frac{2\pi b}{d_1} + \ln\left(1 + \frac{2\pi b}{d_1}\right)\right) \right] + \frac{d_1 d_2 (n-1)(d_1 + d_2)}{\pi b(n d_2 + (n-1) d_1)} \left( \frac{\ln\frac{d_1 + d_2}{d_1}}{d_2} + \frac{\ln\frac{d_1 + d_2}{d_2}}{d_1} \right) \quad (3)$$

In the foregoing formula (3), $C_i$ represents a standard capacitance value of the capacitive sensor including a plurality of plate pairs (the fringe field line is not considered), $C_{e0}$ represents a total capacitance value of the capacitive sensor including the plurality of plate pairs, $\delta_H$ represents a difference between $C_{e0}$ and $C_i$, and a smaller value of $\delta_H$ indicates weaker fringe field effect of the capacitor.

Figure 7:
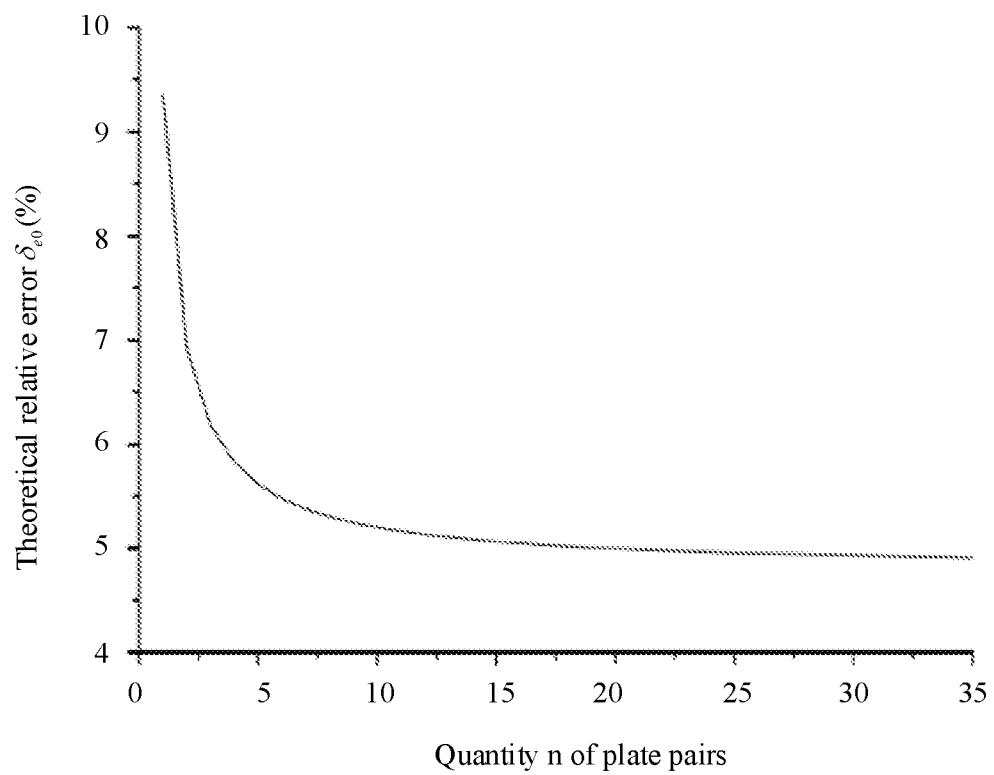
FIG. 7 is a schematic diagram of a relationship between fringe field effect and a quantity of plate pairs of a capacitive sensor.

A relationship between $\delta_H$ and a quantity n of plate pairs is shown in FIG. 7. In FIG. 7, a larger value of n indicates a smaller value of $\delta_H$ and weaker fringe field effect of the capacitor.

Optionally, the capacitive sensor is made of a flexible conductive material.

When the capacitive sensor is made of the flexible conductive material, it is easy to dispose or fasten the capacitive sensor in the electronic device.

The flexible conductive material may be a conductive material with good flexibility, for example, gold, silver, and graphene.

Optionally, the capacitive sensor is obtained through three-dimensional (3 dimensions, 3D) printing.

In the capacitive sensor in this embodiment of this application, when the capacitive sensor includes the first electrode and the second electrode, extension directions of the first electrode and the second electrode may be the same. As shown in FIG. 2, FIG. 5, and FIG. 6, extension directions of the first electrode and the second electrode are the same.

In the capacitive sensor in this embodiment of this application, when the capacitive sensor includes the first electrode and the second electrode, extension directions of the first electrode and the second electrode may alternatively be different.

FIG. 8 is a schematic diagram of a structure of the capacitive sensor according to an embodiment of this application. As shown in FIG. 8, extension directions of the first electrode and the second electrode are opposite.

In other words, extension directions of the first electrode and the second electrode of the capacitive sensor in this embodiment of this application may be flexibly set. The extension directions of the first electrode and the second electrode may be set to be the same as required, or the extension directions of the first electrode and the second electrode may be set to be opposite as required, so that the capacitive sensor is disposed or installed in the electronic device, and space occupied by the capacitive sensor can be reduced as much as possible.

The capacitive sensor in this embodiment of this application may be disposed in the electronic device, to detect the air gesture of the user, so as to control the electronic device by using the air gesture of the user.

Figure 9:
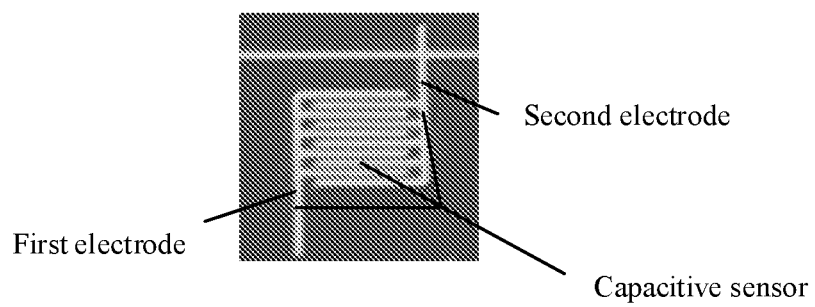
FIG. 9 is a physical schematic diagram of a capacitive sensor.

FIG. 9 is a physical schematic diagram of a capacitive sensor. In FIG. 9, the capacitive sensor includes the first electrode and the second electrode that have opposite extension directions, and a plurality of first plates and a plurality of second plates. The plurality of first plates and the plurality of second plates are alternately arranged to form a plurality of plate pairs.

Optionally, in each plate pair in the capacitive sensor, a ratio of an effective electrode length to the spacing between plates is greater than or equal to 8 and less than or equal to 12.

For an electrode pair, the effective electrode length may be a length of an overlapping portion between two electrodes that are disposed opposite to each other in the electrode pair.

When the ratio of the effective electrode length to the spacing between plates in each plate pair is between 8 and 12, the capacitive sensor can have proper capacitance, and a strong fringe field can be formed, so that the air gesture of the user can be better detected.

Figure 10:
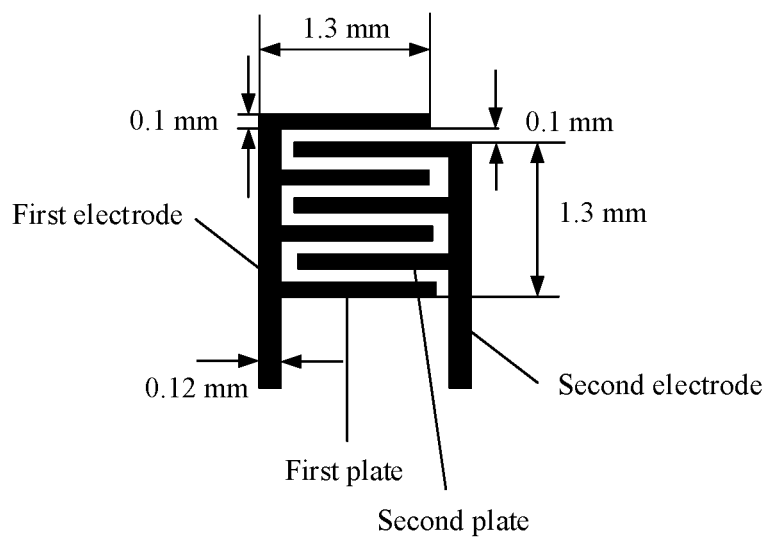
FIG. 10 is a schematic diagram of dimensions of a capacitive sensor.

The following uses FIG. 10 as an example to describe specific dimensions of the capacitive sensor.

FIG. 10 is a schematic diagram of dimensions of the capacitive sensor.

As shown in FIG. 10, the capacitive sensor includes four first plates and three second plates. The four first plates are connected to the first electrode. The three second plates are connected to the second electrode. The four first plates and the three second plates form six plate pairs. In FIG. 10, a length of a single plate (a first plate or a second plate) is 1.3 mm, a width of the single plate is 0.1 mm, a spacing between plates is 0.1 mm, a width of the first electrode and a width of the second electrode are 0.12 mm, and a length of an electrode area formed by six electrode pairs is 1.3 mm.

It should be understood that FIG. 10 is merely an example of specific dimensions of the capacitive sensor, and does not constitute any limitation on the dimensions of the capacitive sensor.

The foregoing describes in detail the capacitive sensor in this embodiment of this application with reference to FIG. 1 to FIG. 10. The following describes in detail an electronic device in embodiments of this application with reference to the accompanying drawings.

Figure 11:
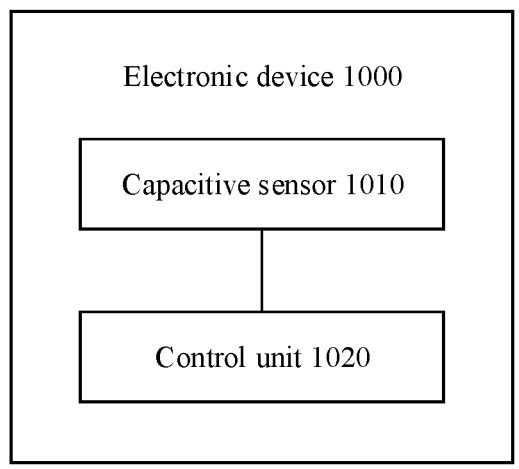
FIG. 11 is a schematic block diagram of an electronic device according to an embodiment of this application.

FIG. 11 is a schematic block diagram of an electronic device according to an embodiment of this application. The electronic device 1000 shown in FIG. 11 includes a capacitive sensor 1010 and a control unit 1020. The following describes functions of the sensor 1010 and the control unit 1020 in detail.

The capacitive sensor 1010 is configured to detect an air operation performed by a user, to generate a detection signal.

The control unit 1020 is configured to recognize an air gesture of the user based on the detection signal and control the electronic device to perform an operation matching the air gesture of the user.

The capacitive sensor 1010 herein may be any capacitive sensor that can detect the air gesture of the user based on fringe field effect.

The detection signal indicates a capacitance change of the capacitive sensor. Specifically, the detection signal may indicate a (real-time) change of a capacitance value of the capacitive sensor.

It should be understood that the foregoing control unit may keep an electrical connection to the capacitive sensor, so that the control unit can obtain the detection signal from the capacitive sensor, to recognize the air gesture of the user based on the detection signal.

Due to conductivity of human skin, when a hand of the user appears in an area in which a fringe field of the capacitive sensor is located, capacitance of the capacitive sensor changes. In addition, when the user makes different air gestures, capacitance of the capacitive sensor changes in different cases. Therefore, the air gesture of the user can be detected by using the capacitive sensor.

In this application, because the capacitive sensor is characterized by a small size and low energy consumption, and can detect the air gesture of the user based on the fringe field effect of the capacitive sensor, compared with a conventional electronic device, the electronic device in this application can reduce space occupied by the capacitive sensor in the electronic device and energy consumption generated by the capacitive sensor while detecting the air gesture of the user.

When the user makes different air gestures, the capacitance of the capacitive sensor changes in different cases, that is, there is a specific correspondence between the air gesture and the capacitance of the capacitive sensor. Therefore, the air gesture of the user may be determined based on the correspondence between the air gesture and the capacitance of the capacitive sensor.

The electronic device 1000 shown in FIG. 11 may be specifically a mobile terminal (such as a smartphone), a smartwatch, a smart band, a computer, a personal digital assistant, an in-vehicle multimedia device, an IoT device, a wearable device, or the like.

Optionally, in an embodiment, the control unit 1020 is configured to determine the air gesture of the user based on the detection signal and first correspondence information.

The first correspondence information indicates air gestures corresponding to different detection signals.

Specifically, the control unit 1020 may determine, based on the first correspondence information, the air gesture corresponding to the detection signal, and determine that the air gesture corresponding to the detection signal is the air gesture of the user.

The first correspondence information may indicate correspondences between different detection signals and different air gestures. The first correspondence information may be manually determined.

The first correspondence information may be stored in the electronic device. When recognizing the air gesture of the user based on the detection signal, the electronic device may first obtain the first correspondence information, and then determine, based on the first correspondence information, the air gesture corresponding to the detection signal.

Optionally, the foregoing control unit 1020 is configured to input the detection signal into a gesture recognition model for processing, to recognize the air gesture of the user.

The gesture recognition model is obtained through training based on training data. The training data includes a plurality of detection signals and air gestures corresponding to the plurality of detection signals.

Specifically, when the gesture recognition model is trained, classification and testing may be first performed on various air gestures, various detection signals are simultaneously collected through sensing of a plurality of capacitors and converted into digital signals, and then the digital signals are input into the gesture recognition model for training. Through supervised learning, a gesture recognition model including correspondences between various capacitive sensor change trends and a specific air operation is obtained.

The gesture recognition model may be a neural network model.

For example, the gesture recognition model may be implemented by using a simple neural network model (for example, a simple regression model), or may be implemented by using a complex neural network model (for example, a neural network with a large quantity of layers and a complex network connection relationship).

It should be understood that the gesture recognition model may include the first correspondence information. When the detection signal is input into the gesture recognition model for processing, the gesture recognition model can determine, based on the first correspondence information, the air gesture corresponding to the detection signal, to recognize the air gesture of the user (the air gesture corresponding to the detection signal is the recognized air gesture of the user).

When the gesture recognition model is obtained, a specific quantity (for example, 10 to 100) of gesture samples may be first collected through supervised learning for learning, and regression and classification are performed on gestures, to finally establish the gesture recognition model.

Supervised learning refers to learning a function (model parameter) from a specified training dataset. After a new number is obtained, a prediction result may be determined based on the function. The training set for supervised learning needs to include input and output, that is, a feature and a target. The target in the training set is labeled by people.

Supervised learning is the most common classification (distinguish classification from clustering) problem. Existing training samples (known data and corresponding output thereof) are used to train an optimal model (the model belongs to a function set, and optimum indicates that the model is optimal under an evaluation criterion). Then, the model is used to map all input to corresponding output and perform simple judgment on the output to implement classification. In this way, unknown data can be classified.

In addition, supervised learning is a common technology for training a neural network and a decision tree. These two technologies highly depend on information provided by a pre-determined classification system. For the neural network, the classification system can use the information to determine an error of the network, and then continuously adjust network parameters. For the decision tree, the classification system uses it to determine which attributes provide the most information.

In this embodiment of this application, after the gesture recognition model is built, the detection signal may be obtained from the capacitive sensor, and the detection signal is converted into a current change signal. Then, the current change signal may be recognized by using the gesture recognition model, to obtain a gesture matching the detection signal. The algorithms, such as Bayes and Decision Tree, can be used for recognition.

The following briefly describes the Bayes algorithm.

Generally, a probability of event A under the condition that event B occurs is different from a probability of event B under the condition that event A occurs. However, there is a specific relationship between the two probabilities, and the Bayes theorem is the statement of this relationship.

The Bayes formula is used to infer a fourth probability from the known three probabilities. Its content is as follows: If B occurs, a probability of A is equal to the probability of B under the condition that event A occurs multiplied by a probability of A and then divided by a probability of B. By associating A with B, a probability that, when an event occurs, another event occurs, is calculated, that is, the result is traced back to the source (that is, a reverse probability). Generally speaking, when you cannot determine a probability of an event, you can infer the probability of the event from a probability of an event related to the essential attribute of the event. In mathematical language, a greater quantity of occurrences of an event that supports an attribute indicates a higher probability of the event.

In conclusion, gesture recognition performed by using the Bayes formula is mainly to determine, by analyzing association between different gestures, the gesture matching the detection signal.

In this application, the electronic device may always work in an air operation mode. As long as the user makes a corresponding air gesture, the electronic device detects the air gesture of the user, and performs an operation matching the air gesture of the user.

Alternatively, in this application, the control unit may first determine whether the electronic device works in an air operation mode. If the electronic device works in the air operation mode, the electronic device is controlled to perform an operation matching the air gesture of the user.

It should be understood that, before the control unit 1020 controls the electronic device to perform the operation matching the air gesture of the user, the control unit 1020 may be further configured to determine whether the electronic device works in the air operation mode.

In this application, after determining that the electronic device works in the air operation mode, the control unit 1020 controls the electronic device to perform the operation matching the air gesture of the user, so that a misoperation or a false response of the electronic device can be avoided.

In this application, the control unit 1020 may determine, in a plurality of manners, that the electronic device works in the air operation mode. The following describes several possible manners in detail.

A first manner: Determine, based on the air gesture of the user, whether the electronic device works in the air operation mode.

In the first manner, that the control unit 1020 determines whether the electronic device works in the air operation mode may specifically include steps 2001 to 2003.

2001: Determine whether the air gesture of the user is a first air gesture.

2002: When the air gesture of the user is the first air gesture, determine that the electronic device works in the air operation mode.

2003: When the air gesture of the user is not the first air gesture, determine that the electronic device works in a non-air operation mode.

The first air gesture may be one gesture, or may be a plurality of gestures. When the first air gesture includes a plurality of gestures, provided that the user makes any one of the plurality of gestures, it may be considered that the user makes the first air gesture.

The first air gesture may be a preset specific operation gesture.

The first air gesture may be specifically a gesture such as a left-slide gesture, a right-slide gesture, a flip-up gesture, a flip-down gesture, or a confirmation gesture.

The first air gesture herein may be an air gesture that triggers the user to work in the air operation mode. Only when the control unit detects that the air gesture of the user is a first air operation, the control unit controls the electronic device to perform the operation matching the air gesture of the user.

When the air gesture of the user is not the first air gesture, the control unit does not control the electronic device to perform the operation matching the air gesture of the user. In this case, the user may control the electronic device in another manner (for example, a key operation or a touch operation).

Figure 12:
FIG. 12 is a schematic diagram of a first air gesture.

FIG. 12 is a schematic diagram of the first air gesture (which may be referred to as a determining gesture). When the user makes the air gesture shown in FIG. 12, it may be determined that the electronic device works in the air operation mode.

Optionally, in an embodiment, when the electronic device is in the air operation mode, the control unit is further configured to: when the air gesture of the user is a second air gesture, switch a working mode of the electronic device from the air operation mode to the non-air operation mode.

The second air gesture may be an air gesture that enables the electronic device to exit the air operation mode. The user can flexibly control, by using the second air gesture, the electronic device to switch from the air operation mode to the non-air operation mode, thereby implementing flexible switching of the working mode of the electronic device.

A second manner: Determine, based on a status of an air operation mode switch, whether the electronic device works in the air operation mode.

In the second manner, that the control unit 1020 determines whether the electronic device works in the air operation mode may specifically include steps 3001 to 3003.

3001: Determine whether the air operation mode switch of the electronic device is in an on state.

3002: When the air operation mode switch of the electronic device starts to be in the on state, determine that the electronic device works in the air operation mode.

3003: When the air operation mode switch of the electronic device starts to be in an off state, determine that the electronic device works in a non-air operation mode.

The air operation mode switch may be a mechanical switch. In this case, the user may turn on or off the air operation mode switch. In addition, the air operation mode may also be an electronic switch. In this case, the user may control, by using a key or touchscreen operation, whether the electronic device enters the air operation mode.

The air operation mode switch may be a mechanical switch or an electronic switch.

When the air operation mode switch is the mechanical switch, the air operation mode switch may be a button or a key, and the user may set, by operating the button or the key, whether the electronic device works in the air operation mode. In this case, the control unit may determine, by detecting a status of a corresponding button or switch, whether the electronic device works in the air operation mode.

When the air operation mode is the electronic switch, the user may set, in a manner of setting state information of the electronic device by performing the touch operation, whether the electronic device works in the air operation mode. In this case, the control unit may determine, by detecting the state information of the electronic device, whether the electronic device works in the air operation mode.

It should be understood that, when the air operation mode switch of the electronic device is in the off state, the control unit does not control the electronic device to perform the operation matching the air gesture of the user. Further, the control unit does not recognize the air gesture of the user based on the detection signal. Further, the capacitive sensor does not detect the air gesture of the user and generate the detection signal based on the fringe field effect.

For example, when the air operation mode switch of the electronic device is in the off state, the control unit is disconnected from the capacitive sensor, and the control unit cannot obtain the detection signal and cannot recognize the air gesture of the user based on the detection signal.

For another example, when the air operation mode switch of the electronic device is in the off state, no voltage may be applied to two ends of the capacitive sensor. In this case, the capacitive sensor does not detect the air gesture of the user and generate the detection signal based on the fringe field effect.

A third manner: Determine, based on a posture of the electronic device, whether the electronic device works in the air operation mode.

In the third manner, that the control unit 1020 determines whether the electronic device works in the air operation mode may specifically include steps 4001 to 4003.

4001: Determine whether the posture of the electronic device is a first posture.

4002: When the posture of the electronic device is the first posture, determine that the electronic device works in the air operation mode.

4003: When the posture of the electronic device is another posture other than the first posture, determine that the electronic device works in a non-air operation mode.

The first posture may be one posture, or may be a plurality of postures. When the first posture includes a plurality of postures, provided that the electronic device is in any one of the plurality of posture gestures, it may be considered that the electronic device is in the first posture.

In other words, the control unit may determine whether the electronic device works in the first posture. When the electronic device is in the first posture, the control unit determines that the electronic device works in the air operation mode. When the electronic device is in a second posture, the control unit determines that the electronic device works in the non-air operation mode.

When the electronic device works in the non-air operation mode, the control unit does not control the electronic device to perform the operation matching the air gesture of the user. In this case, the user may input an operation signal to the electronic device in another manner (for example, a key operation or a touch operation), and then the control unit controls the electronic device based on the operation signal input by the user.

The first posture may include horizontal placement and vertical placement. The electronic device being in the first posture may mean that the electronic device is in a horizontal placement state or a vertical placement state.

The posture of the electronic device may be determined based on information detected by a gyroscope.

A fourth manner: Determine, based on a distance between the user and the capacitive sensor, whether the electronic device works in the air operation mode.

In the fourth manner, that the control unit 1020 determines whether the electronic device works in the air operation mode may specifically include steps 5001 to 5003.

5001: Determine the duration and the distance between the user and the capacitive sensor.

5002: When the distance between the user and the capacitive sensor is less than or equal to a preset distance and the duration is greater than or equal to a preset period of time, determine that the electronic device works in the air operation mode.

5003: When the distance between the user and the capacitive sensor is greater than a preset distance, determine that the electronic device works in a non-air operation mode.

5004: When the distance between the user and the capacitive sensor is less than a preset distance and the duration is less than a preset period of time, determine that the electronic device works in a non-air operation mode.

In the step 5001, the electronic device may determine the distance between the user and the capacitive sensor by using a distance sensor. The control unit may obtain information about the distance between the user and the capacitive sensor from the distance sensor.

It should be understood that, in this application, the capacitive sensor may always detect the air gesture of the user. As long as the detection signal generated by the capacitive sensor is obtained, the control unit determines the air gesture of the user based on the detection signal. However, whether the control unit controls the electronic device to perform the operation matching the air gesture of the user depends on whether the electronic device works in the air operation mode.

It should be understood that the capacitive sensor 1010 may be the capacitive sensor described in FIG. 1 to FIG. 10 above. The following briefly describes a structure of the capacitive sensor 1010 with reference to the accompanying drawings. For a detailed description of a specific structure of the capacitive sensor 1010, refer to the description of the capacitive sensor in FIG. 1 to FIG. 10.

The capacitive sensor includes M plate pairs. Each of the M plate pairs includes a first plate and a second plate that are placed opposite to each other.

In each plate pair, a ratio of a plate length of each plate pair to a spacing in each plate pair is greater than 1 and less than or equal to 30. M is a positive integer.

In each plate pair, the plate length may be a length of parts of plates that are opposite to each other in the plate pair, or may be a length of the first plate or the second plate that forms the plate pair.

Optionally, the first plate and the second plate in each of the M plate pairs are both made of a wavy conductive material.

In this application, the ratio of the plate length to the spacing between plates in the plate pair in the capacitive sensor is between 1 and 30, so that the capacitive sensor has strong fringe field effect. Therefore, the air gesture of the user can be better detected by placing the capacitive sensor in the electronic device.

Optionally, a ratio of a plate length of each plate pair to a spacing in each plate pair of the M plate pairs is greater than 1 and less than or equal to 15.

When the ratio of the plate length of each plate pair to the spacing in the plate pair in the capacitive sensor is greater than 1 and less than or equal to 15, the fringe field effect of the capacitive sensor is stronger, so that the capacitive sensor has higher sensitivity when detecting the air gesture of the user.

Optionally, the first plate and the second plate in each of the M plate pairs are both made of any one of a rectangular conductive material, a cylindrical conductive material, and a wavy conductive material.

When the plate in each plate pair is in a rectangular shape, an area in which the plates of the plate pair in the capacitive sensor are opposite to each other can be increased when space is fixed, so that the capacitive sensor has a large capacitance value. When the user connects to the fringe field of the capacitive sensor by using different air gestures, the capacitance value of the capacitive sensor also obviously changes, which helps better detect the air gesture of the user.

When the plate in each plate pair in the capacitive sensor is in a wavy shape, the plate length of the plate pair in the capacitive sensor can be increased when space is fixed, so that the capacitive sensor has a large capacitance value. When the user connects to the fringe field of the capacitive sensor by using different air gestures, the capacitance value of the capacitive sensor also obviously changes, which helps better detect the air gesture of the user.

Optionally, M is greater than 1. The M plate pairs each are formed by alternately arranging the first plate and the second plate.

When M is greater than 1, the capacitive sensor includes a plurality of plate pairs, and the capacitance value of the capacitive sensor can be increased, so that the electronic device can better detect the air gesture of the user by using the capacitive sensor.

Generally, if the capacitance value of the capacitive sensor is excessively small, it is difficult to detect the capacitance value. Then, M is set to a value greater than 1, so that the capacitive sensor can have a specific capacitance value, thereby facilitating detection of a capacitance value change of the capacitive sensor.

Optionally, in an embodiment, the capacitive sensor 1010 further includes a first electrode and a second electrode. All first plates in the M plate pairs are connected to the first electrode. All second plates in the M plate pairs are connected to the second electrode.

The first electrode and the second electrode may connect the capacitive sensor 1010 to the control unit 1020.

When the capacitive sensor 1010 includes the M plate pairs, and further includes the first electrode and the second electrode, the capacitive sensor 1010 may be referred to as a double-comb capacitive sensor. By using the double-comb capacitive sensor, the capacitance value of the capacitive sensor 1010 and the fringe field effect of the capacitive sensor can be increased as much as possible in a case of limited space, to better detect the air gesture of the user subsequently.

Optionally, M is less than or equal to 30.

When M is less than or equal to 30, the capacitive sensor 1010 can have a large capacitance value and strong capacitance field effect without occupying large space, so that the capacitive sensor is easy to be disposed in the electronic device to detect a gesture of the user.

Optionally, in an embodiment, the capacitive sensor 1010 is made of a flexible conductive material.

When the capacitive sensor is made of the flexible conductive material, it is easy to dispose or fasten the capacitive sensor in the electronic device.

Optionally, the electrodes (the first electrode and the second electrode) and the plates (the first plate and the second plate) of the capacitive sensor 1010 are made of any one of gold, silver, and copper.

Optionally, in an embodiment, the capacitive sensor 1010 is disposed on a surface of the electronic device in a 3D printing manner.

The capacitive sensor 1010 is disposed on the surface of the electronic device in the 3D printing manner, so that complexity of installing the capacitive sensor in the electronic device can be reduced, and a technological process can be simplified.

Optionally, in each plate pair, a ratio of an effective electrode length to the spacing between plates is greater than or equal to 8 and less than or equal to 12.

For an electrode pair, the effective electrode length may be a length of an overlapping portion between two electrodes that are disposed opposite to each other in the electrode pair.

When the ratio of the effective electrode length to the spacing between plates in each plate pair is between 8 and 12, the capacitive sensor can have proper capacitance, and a strong fringe field can be formed, so that the air gesture of the user can be better detected.

In this application, the capacitive sensor 1010 may be attached to the surface of the electronic device 1000. Specifically, the capacitive sensor 1010 may be attached to a side of an operation surface of the electronic device 1000. When the user makes an air gesture on the surface of the electronic device, the air gesture of the user may be detected by using the capacitive sensor 1010 in the electronic device 1000.

Figure 13:
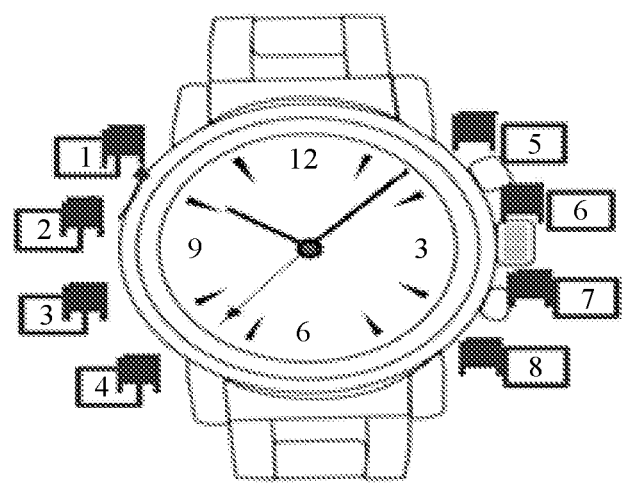
FIG. 13 is a schematic diagram in which a capacitive sensor is disposed on a surface of a smartwatch.

As shown in FIG. 13, when the electronic device 1000 is the smartwatch, the capacitive sensor 1010 may be attached to a surface of a watch face of the smartwatch. Specifically, the capacitive sensor 1010 may be attached to a bezel, a screen (not limited to a bezel or a screen of the smartwatch), or the like. As shown in FIG. 13, there are eight capacitive sensors (respectively numbered 1 to 8) on the smartwatch in total. The eight capacitive sensors may be evenly attached to the bezel of the smartwatch.

In addition, two ends of the capacitive sensor may be connected to a watch face circuit by using a conductive material. When a hand of the user is close to the capacitive sensor for a specific distance (for example, 15 cm), the capacitance of the capacitive sensor changes, resulting in a voltage change in the watch face circuit. In this way, the capacitive sensor can detect a detection signal generated due to the air gesture of the user.

This application further provides an electronic device. The following describes the electronic device 6000 with reference to FIG. 14.

Figure 14:
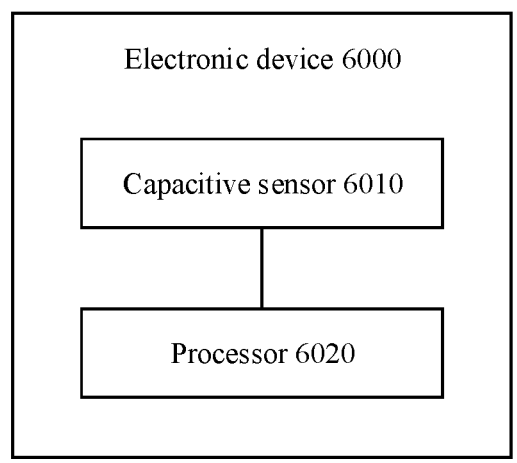
FIG. 14 is a schematic block diagram of an electronic device according to an embodiment of this application.

FIG. 14 is a schematic block diagram of the electronic device according to an embodiment of this application. The electronic device 6000 shown in FIG. 14 includes a capacitive sensor 6010 and a processor 6020. The following describes functions of the capacitive sensor 6010 and the processor 6020.

The capacitive sensor 6010 is configured to detect an air gesture of a user and generate a detection signal based on fringe field effect. The processor 6020 is configured to recognize the air gesture of the user based on the detection signal and control the electronic device 6000 to perform an operation matching the air gesture of the user.

The detection signal may indicate a capacitance change of the capacitive sensor.

The processor may be a module or a unit having a data processing function in the electronic device. Specifically, the processor may be a central processing unit (central processing unit, CPU) or a hardware circuit having a data processing function.

A structure of the capacitive sensor 6010 may be the same as that of the capacitive sensor 1010. For a detailed structure of the capacitive sensor 6010, refer to descriptions of the structure of the capacitive sensor in FIG. 1 to FIG. 10.

In this application, because the capacitive sensor is characterized by a small size and low energy consumption, and can detect the air gesture of the user based on the fringe field effect of the capacitive sensor, compared with a conventional electronic device, the electronic device in this application can reduce space occupied by the capacitive sensor in the electronic device and energy consumption generated by the capacitive sensor while detecting the air gesture of the user.

The electronic device 6000 shown in FIG. 14 may be a mobile terminal (such as a smartphone), a smartwatch, a smart band, a computer, a personal digital assistant, an in-vehicle multimedia device, an IoT device, a wearable device, or the like.

Optionally, the electronic device 6000 may further include a communication interface, a memory, and the like. The following provides a description with reference to FIG. 15.

Figure 15:
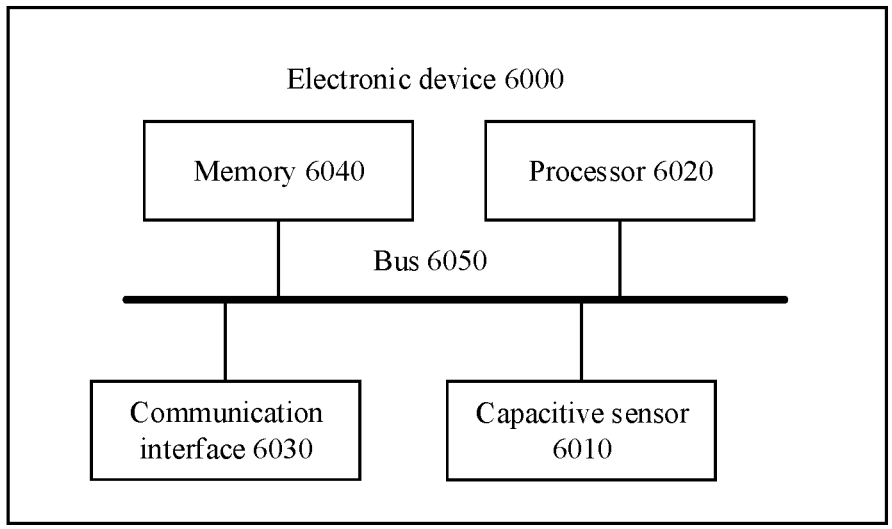
FIG. 15 is a schematic block diagram of an electronic device according to an embodiment of this application.

FIG. 15 is a schematic block diagram of the electronic device according to an embodiment of this application. The electronic device 6000 shown in FIG. 15 includes the capacitive sensor 6010, the processor 6020, the communication interface 6030, the memory 6040, and a bus 6050. The memory 6040, the processor 6020, and the communication interface 6030 may implement mutual communication connections through the bus 6050. The following briefly describes each module.

The memory 6040 may be a read-only memory (ROM), a static storage device, or a random access memory (RAM). The memory 6040 may store a program. When the program stored in the memory 6040 is executed by the processor 6020, the processor 6020 and the communication interface 6030 may be configured to perform steps of an electronic device control method in embodiments of this application described below.

The processor 6020 may be a general-purpose CPU, a microprocessor, an application-specific integrated circuit (ASIC), a graphics processing unit (GPU), or one or more integrated circuits, to execute a related program, so as to implement a function that needs to be executed by a unit in the electronic device in embodiments of this application, or perform the electronic device control method in embodiments of this application.

Alternatively, the processor 6020 may be an integrated circuit chip and has a signal processing capability. In an implementation process, the steps of the electronic device control method in embodiments of this application may be completed by using an integrated logic circuit of hardware in the processor 6020, or instructions in a software form.

The foregoing processor 6020 may alternatively be a general-purpose processor, a digital signal processor (DSP), an application-specific integrated circuit (ASIC), a field programmable gate array (FPGA) or another programmable logic device, a discrete gate or transistor logic device, or a discrete hardware component. The processor may implement or perform the methods, the steps, and the logical block diagrams that are disclosed in embodiments of this application. The general-purpose processor may be a microprocessor, or the processor may be any conventional processor or the like. The steps of the methods disclosed with reference to embodiments of this application may be directly performed and accomplished by a hardware decoding processor, or may be performed and accomplished by using a combination of hardware and software modules in the decoding processor. A software module may be located in a mature storage medium in the art, such as a random access memory, a flash memory, a read-only memory, a programmable read-only memory, an electrically erasable programmable memory, or a register. The storage medium is located in the memory 6040. The processor 6020 may read information from the memory 6040, and implement, in combination with the hardware of the processor 6020, the functions that need to be performed by the unit included in the electronic device in embodiments of this application, or perform the electronic device control method in embodiments of this application.

The communication interface 6030 uses a transceiver apparatus, for example, including but not limited to a transceiver, to implement communication between the electronic device 6000 and another device or a communication network.

The bus 6050 may include a path for information transfer between various components (for example, the memory 6040, the processor 6020, and the communication interface 6030) of the electronic device 6000.

It should be noted that although only the modules, such as the memory, the processor, and the communication interface in the device 6000 are illustrated, in a specific implementation process, a person skilled in the art should understand that the device 6000 may further include another component necessary for normal running. In addition, based on a specific requirement, a person skilled in the art should understand that the device 6000 may further include hardware components for implementing other additional functions. In addition, a person skilled in the art should understand that the device 6000 may alternatively include only components that are necessary to implement embodiments of this application, but does not necessarily include all the components shown in FIG. 15.

The control unit 1020 in the electronic device 1000 in FIG. 11 is equivalent to the processor 6020 in the electronic device 6000 in FIG. 14 or FIG. 15. The control unit 1020 can implement a same function as the processor 6020. Both the control unit 1020 and the processor 6020 can perform the electronic device control method in embodiments of this application described below.

Generally, after generating the detection signal, the capacitive sensor may first perform a series of processing on the detection signal, and then determine the air gesture of the user based on a signal obtained through processing. In this case, some signal processing units may be used to process the detection signal. The following describes a structure of an electronic device in this case.

Figure 16:
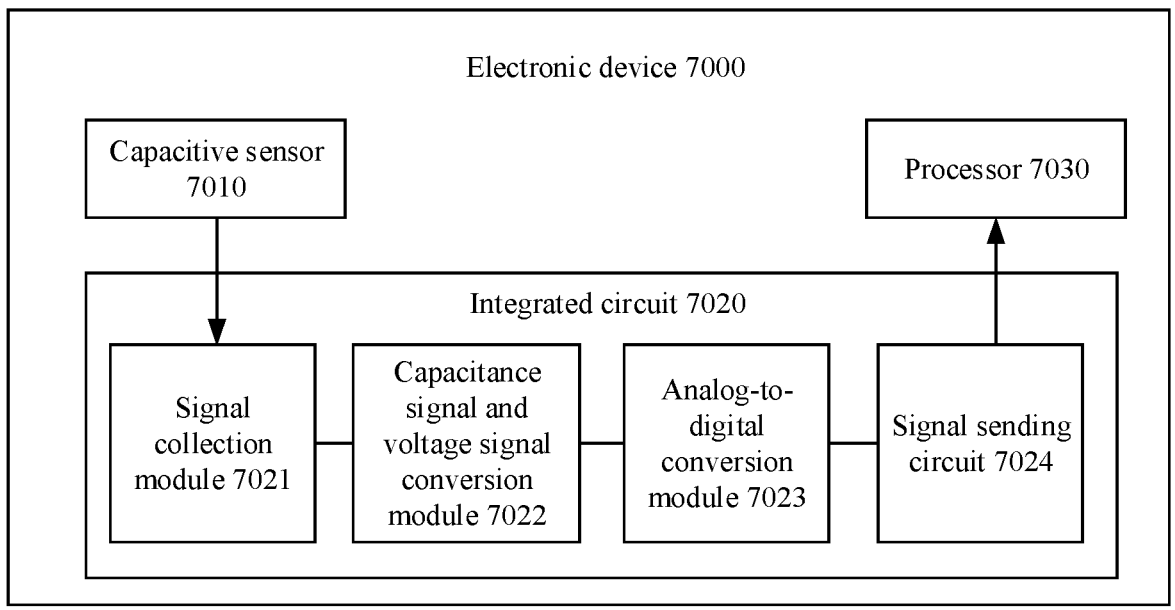
FIG. 16 is a diagram of a structure of an electronic device according to an embodiment of this application.

FIG. 16 is a diagram of a structure of an electronic device according to an embodiment of this application.

A electronic device 7000 shown in FIG. 16 includes a capacitive sensor 7010, an integrated circuit 7020, and a processor 7030. The capacitive sensor 7010 is configured to detect an air gesture of a user and generate a detection signal based on fringe field effect. The integrated circuit 7020 is configured to process the detection signal, to obtain a processed signal. The processor 7030 is configured to recognize the air gesture of the user based on the processed signal and control the electronic device to perform an operation matching the air gesture of the user.

The integrated circuit 7020 specifically includes a signal collection module 7021, a capacitance signal and voltage signal conversion module 7022, an analog-to-digital conversion module 7023, and a signal sending circuit 7024.

The following describes functions of modules in the integrated circuit 7020 in detail.

The signal collection module 7021 is configured to collect the detection signal generated by the capacitive sensor 7010. The detection signal in this case may be a capacitance change value.

The capacitance signal and voltage signal conversion module 7022 is configured to convert the capacitance change value into a voltage change value that can be directly detected by a circuit. The module obtains an analog signal through processing.

The analog-to-digital conversion module 7023 is configured to convert the analog signal into a digital signal.

The signal sending circuit 7024 is configured to transfer the digital signal to the processor 7030 through an SPI protocol, to perform signal identification and processing.

The capacitance signal and voltage signal conversion module 7022 may be specifically a correlated-double-sampling capacitance-to-voltage converter (correlated-double-sampling capacitance-to-voltage converter, CDS-CVC).

In addition, the integrated circuit 7020 and the processor 7030 in the electronic device 7000 shown in FIG. 16 may be equivalent to the processor 6020 shown in FIG. 14 or FIG. 15. The integrated circuit 7020 and the processor 7030 in the electronic device 7000 may alternatively be equivalent to the control unit 1020 in the electronic device 1000 shown in FIG. 11.

It should be understood that the electronic device in this embodiment of this application may include one or more capacitive sensors. When the electronic device in this embodiment of this application includes a plurality of capacitive sensors, when obtaining the detection signal, the control unit or the processor may collect a signal of the capacitive sensor by using a round robin algorithm. Specifically, a signal of a first capacitive sensor may be first collected, and then a signal of a second capacitive sensor is collected. The steps are repeated until collection of signals of all capacitive sensors is completed.

To enhance sampling effect, a chip with a plurality of channels may be further used to simultaneously collect signals of different capacitive sensors. Specifically, in the electronic device in this embodiment of this application, positive and negative alternating conversion may be simultaneously performed on signals of different channels, and it is ensured that signals of a plurality of channels are obtained at the same time. Then, the signals collected from the plurality of channels are serially output, and algorithm demodulation is performed on sampled signals, to obtain characteristic signal values of the plurality of capacitive sensors.

For example, in this application, a chip with 16 channels may simultaneously collect signals of 16 capacitive sensors, so that signals of 16 channels can be simultaneously obtained.

The electronic device in embodiments of this application is described in detail above with reference to FIG. 11 to FIG. 15. The electronic device control method in embodiments of this application is described in detail below with reference to the accompanying drawings. It should be understood that the electronic device control method described below may be performed by the electronic device in embodiments of this application described above. Specifically, the electronic device control method described below may be performed by the control unit or the processor in the electronic device in embodiments of this application described above.

Figure 17:
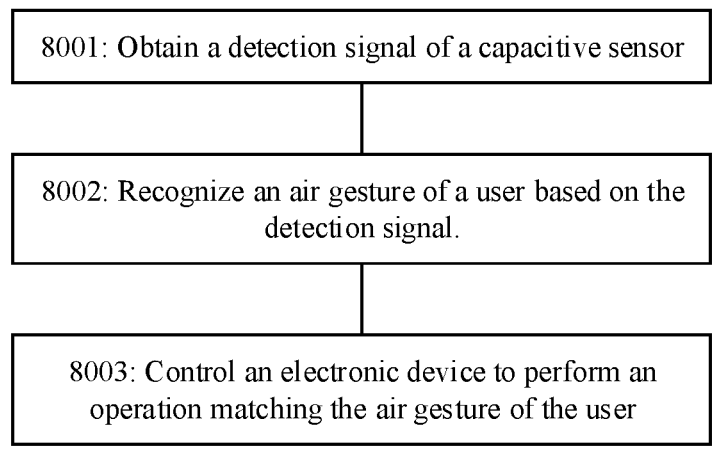
FIG. 17 is a schematic flowchart of an electronic device control method according to an embodiment of this application.

FIG. 17 is a schematic flowchart of an electronic device control method according to an embodiment of this application. The control method 8000 shown in FIG. 17 includes steps 8001 to 8003. The following separately describes the steps in detail.

8001: Obtain a detection signal of a capacitive sensor.

The detection signal is a signal generated based on fringe field effect when the capacitive sensor detects an air gesture of a user. The detection signal may indicate a capacitance change of the capacitive sensor.

Specifically, the detection signal may indicate a (real-time) change of a capacitance value of the capacitive sensor.

8002: Recognize the air gesture of the user based on the detection signal.

8003: Control an electronic device to perform an operation matching the air gesture of the user.

The foregoing control method 8000 may be performed by the electronic device. Specifically, the foregoing control method may be performed by a control unit in the electronic device. The capacitive sensor may be disposed on the electronic device. The foregoing control unit may keep an electrical connection to the capacitive sensor, so that the control unit can obtain the detection signal from the capacitive sensor, to recognize the air gesture of the user based on the detection signal.

Due to conductivity of human skin, when a hand of the user appears in an area in which a fringe field of the capacitive sensor is located, capacitance of the capacitive sensor changes. In addition, when the user makes different air gestures, capacitance of the capacitive sensor changes in different cases. Therefore, the air gesture of the user can be detected by using the capacitive sensor.

In this application, because the capacitive sensor is characterized by a small size and low energy consumption, and can detect the air gesture of the user based on the fringe field effect of the capacitive sensor, compared with a conventional electronic device control method, the control method in this application can reduce space occupied by the capacitive sensor in the electronic device and energy consumption generated by the capacitive sensor while detecting the air gesture of the user.

Because there is a specific correspondence between the detection signal obtained from the capacitive sensor and the air gesture of the user, after the detection signal is obtained from the capacitive sensor, the air gesture of the user may be determined based on the correspondence.

Optionally, the foregoing step 8002 specifically includes: determining the air gesture of the user based on the detection signal and first correspondence information.

The first correspondence information indicates air gestures corresponding to different detection signals.

Specifically, when the air gesture of the user is recognized, the air gesture corresponding to the detection signal may be determined based on the first correspondence information, and the air gesture corresponding to the detection signal is determined as the air gesture of the user.

The first correspondence information may indicate correspondences between different detection signals and different air gestures. The first correspondence information may be manually determined.

The first correspondence information may be stored in the electronic device. When recognizing the air gesture of the user based on the detection signal, the electronic device may first obtain the first correspondence information, and then determine, based on the first correspondence information, the air gesture corresponding to the detection signal.

Optionally, the foregoing step 8002 specifically includes: inputting the detection signal into a gesture recognition model for processing, to recognize the air gesture of the user.

The gesture recognition model is obtained through training based on training data. The training data includes a plurality of detection signals and air gestures corresponding to the plurality of detection signals.

It should be understood that the gesture recognition model may include the first correspondence information. When the detection signal is input into the gesture recognition model for processing, the gesture recognition model can determine, based on the first correspondence information, the air gesture corresponding to the detection signal, to recognize the air gesture of the user (the air gesture corresponding to the detection signal is the recognized air gesture of the user).

When the gesture recognition model is trained, classification and testing may be first performed on various air gestures, various detection signals are simultaneously collected through sensing of a plurality of capacitors and converted into digital signals, and then the digital signals are input into the gesture recognition model for training. Through supervised learning, a gesture recognition model including correspondences between various capacitive sensor change trends and a specific air operation is obtained.

Correspondences between different detection signals and air gestures may be complex, so that the correspondence between different detection signals and air gestures can be better reflected by using the gesture recognition model, and the air gesture of the user can be better and more accurately recognized subsequently by using the gesture recognition model.

Optionally, the foregoing step 8002 specifically includes: inputting the detection signal into a regression model for processing, to recognize the air gesture of the user.

The regression model is obtained through training based on training data. The training data includes a plurality of detection signals and air gestures corresponding to the plurality of detection signals.

The regression model may be obtained through supervised machine learning.

Figure 18:
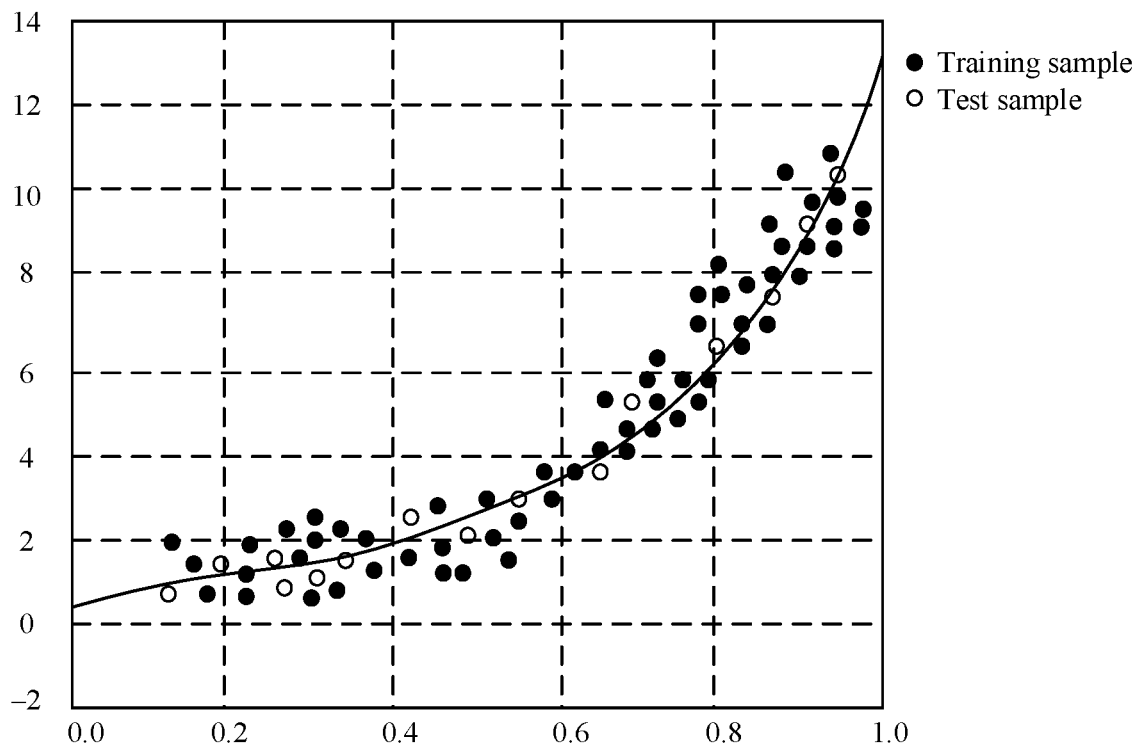
FIG. 18 is a schematic diagram of a curve obtained through fitting based on a training sample.

As shown in FIG. 18, for a plurality of pieces of sample data (x, y), mapping from f(x) to y may be built, where x may represent data corresponding to a detection signal, and y represents data corresponding to an air gesture. A model relative to time series data may be built. In this application, the time series data may represent data that each sensor changes with time (actually a gesture change process) in a gesture process.

To build the model relative to the time series data is to build a mapping relationship from f(x1, x2, x3, . . . ) to y1, y2, y3, . . . . The built mapping relationship (formula) is a regression model. As shown in FIG. 18, many discrete points (training samples) may be continuously fit by using a regression curve to form a model. (The curve in the figure is a fit model, and the model may be expressed by using a binary equation.) As shown in FIG. 18, test samples are basically distributed on both sides of the curve, so that fitting effect of the curve is good. Then, the air gesture of the user may be recognized by using the detection signal and the curve obtained through fitting.

In the foregoing control method 8000, before the step 8003 is performed, whether the electronic device works in an air operation mode may be first determined. The step 8003 is performed when the electronic device works in the air operation mode.

In addition, in the foregoing step 8003, when the electronic device is controlled to perform the operation matching the air gesture of the user, the air gesture of the user may be associated with a specific operation command of the electronic device. When a specific gesture of the user is recognized, the electronic device is controlled to execute a command associated with the gesture.

For example, the air gesture shown in FIG. 12 may be associated with an "OK" command. When the air gesture of the user is recognized, the electronic device is controlled to execute the "OK" command.

In the foregoing control method 8000, after the air gesture of the user is recognized, the electronic device may be controlled, based on the air gesture of the user, to perform the operation matching the air gesture of the user. Alternatively, whether the electronic device works in an air operation mode may be first determined. After it is determined that the electronic device works in the air operation mode, the electronic device is controlled to perform the operation matching the air gesture of the user.

Figure 19:
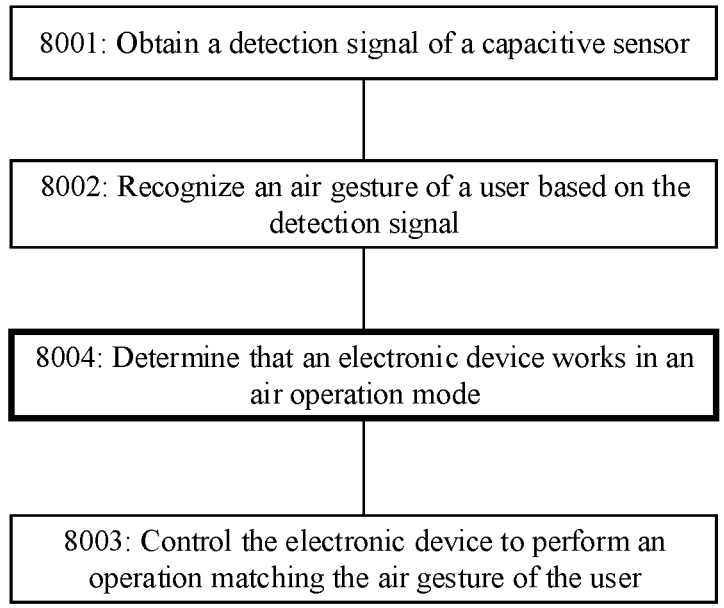
FIG. 19 is a schematic flowchart of an electronic device control method according to an embodiment of this application.

As shown in FIG. 19, the control method 8000 further includes the following steps.

8004: Determine that the electronic device works in the air operation mode.

In this application, after determining that the electronic device works in the air operation mode, the control unit controls the electronic device to perform the operation matching the air gesture of the user, so that a misoperation or a false response of the electronic device can be avoided.

It should be understood that the step 8004 may be performed before the step 8003. The step 8004, the step 8001, and the step 8002 are not subject to a specific sequence in this application. The step 8004 may be performed simultaneously with one of the step 8001 and the step 8002, or may be performed before or after any one of the step 8001 and the step 8002.

In the step 8004, whether the electronic device works in the air operation mode may be determined in a plurality of manners. The following describes several possible determining manners in detail.

Manner A: Determine, based on the air gesture of the user, whether the electronic device works in the air operation mode.

In the manner A, the step 8004 of determining whether the electronic device works in the air operation mode specifically includes steps 8004a to 8004c.

8004a: Determine whether the air gesture of the user is a first air gesture.

8004b: When the air gesture of the user is the first air gesture, determine that the electronic device works in the air operation mode.

8004c: When the air gesture of the user is not the first air gesture, determine that the electronic device works in a non-air operation mode.

The first air gesture may be one gesture, or may be a plurality of gestures. When the first air gesture includes a plurality of gestures, provided that the user makes any one of the plurality of gestures, it may be considered that the user makes the first air gesture.

The first air gesture may be a preset specific operation gesture.

Optionally, in an embodiment, when the electronic device is in the air operation mode, the control unit is further configured to: when the air gesture of the user is a second air gesture, switch a working mode of the electronic device from the air operation mode to the non-air operation mode.

The second air gesture may be an air gesture that enables the electronic device to exit the air operation mode. The user can flexibly control, by using the second air gesture, the electronic device to switch from the air operation mode to the non-air operation mode, thereby implementing flexible switching of the working mode of the electronic device.

In the manner A, the step 8004 may be performed between the step 8002 and the step 8003.

Manner B: Determine, based on a status of an air operation mode switch, whether the electronic device works in the air operation mode.

In the manner B, the step 8004 of determining whether the electronic device works in the air operation mode specifically includes steps 8004e to 8004g.

8004e: Determine whether the air operation mode switch of the electronic device is in an on state.

8004f: When the air operation mode switch of the electronic device starts to be in the on state, determine that the electronic device works in the air operation mode.

8004g: When the air operation mode switch of the electronic device starts to be in an off state, determine that the electronic device works in a non-air operation mode.

The air operation mode switch may be a mechanical switch. In this case, the user may turn on or off the air operation mode switch. In addition, the air operation mode may also be an electronic switch. In this case, the user may control, by using a key or touchscreen operation, whether the electronic device enters the air operation mode.

The air operation mode switch may be a mechanical switch or an electronic switch.

When the air operation mode switch is the mechanical switch, the air operation mode switch may be a button or a key, and the user may set, by operating the button or the key, whether the electronic device works in the air operation mode. In this case, the control unit may determine, by detecting a status of a corresponding button or switch, whether the electronic device works in the air operation mode.

When the air operation mode is the electronic switch, the user may set, in a manner of setting state information of the electronic device by performing the touch operation, whether the electronic device works in the air operation mode. In this case, the control unit may determine, by detecting the state information of the electronic device, whether the electronic device works in the air operation mode.

Manner C: Determine, based on a posture of the electronic device, whether the electronic device works in the air operation mode.

In the manner C, the step 8004 of determining whether the electronic device works in the air operation mode specifically includes steps 8004r to 8004t.

8004r: Determine whether the posture of the electronic device is a first posture.

8004s: When the posture of the electronic device is the first posture, determine that the electronic device works in the air operation mode.

8004t: When the posture of the electronic device is another posture other than the first posture, determine that the electronic device works in a non-air operation mode.

The first posture may be one posture, or may be a plurality of postures. When the first posture includes a plurality of postures, provided that the electronic device is in any one of the plurality of posture gestures, it may be considered that the electronic device is in the first posture.

In other words, the control unit may determine whether the electronic device works in the first posture. When the electronic device is in the first posture, the control unit determines that the electronic device works in the air operation mode. When the electronic device is in a second posture, the control unit determines that the electronic device works in the non-air operation mode.

When the electronic device works in the non-air operation mode, the control unit does not control the electronic device to perform the operation matching the air gesture of the user. In this case, the user may input an operation signal to the electronic device in another manner (for example, a key operation or a touch operation), and then the control unit controls the electronic device based on the operation signal input by the user.

Manner D: Determine, based on a distance between the user and the capacitive sensor, whether the electronic device works in the air operation mode.

In the manner D, the step 8004 of determining whether the electronic device works in the air operation mode specifically includes steps 8004w to 8004z.

8004w: Determine the duration and the distance between the user and the capacitive sensor.

8004x: When the distance between the user and the capacitive sensor is less than or equal to a preset distance and the duration is greater than or equal to a preset period of time, determine that the electronic device works in the air operation mode.

8004y: When the distance between the user and the capacitive sensor is greater than a preset distance, determine that the electronic device works in a non-air operation mode.

8004z: When the distance between the user and the capacitive sensor is less than a preset distance and the duration is less than a preset period of time, determine that the electronic device works in a non-air operation mode.

In the step 8004w, the distance between the user and the capacitive sensor may be determined by using a distance sensor of the electronic device. The control unit may obtain information about the distance between the user and the capacitive sensor from the distance sensor.

The foregoing manner A to manner D are respectively equivalent to the foregoing first manner to fourth manner, and related limitations and explanations of determining, in the first manner to the fourth manner, whether the electronic device works in the air operation mode are also applicable to the manner A to the manner D herein.

In the manner B to the manner D, the step 8004 may be performed simultaneously with one of the step 8001 and the step 8002, or may be performed before or after any one of the step 8001 and the step 8002.

A process of an electronic device control method in embodiments of this application is described in detail below with reference to FIG. 20 to FIG. 23.

Figure 20:
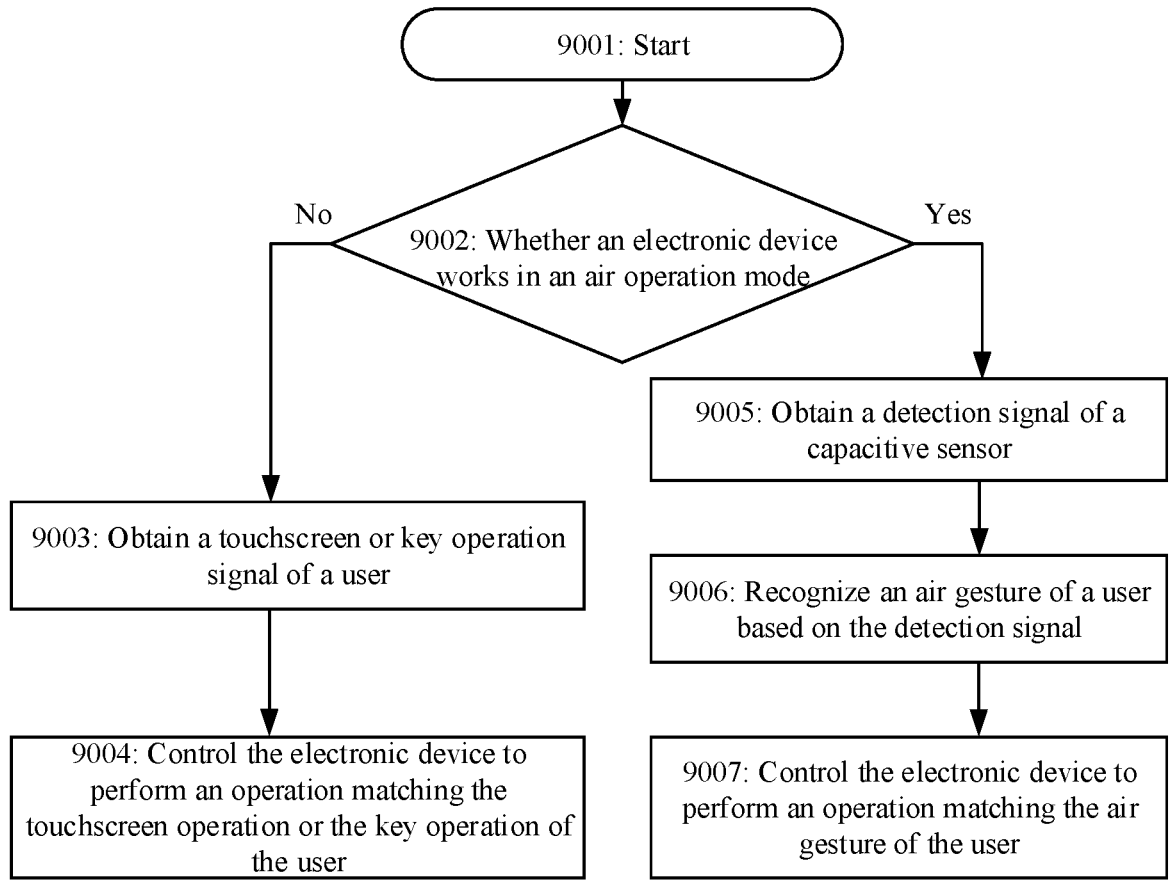
FIG. 20 is a schematic flowchart of an electronic device control method according to an embodiment of this application.

FIG. 20 is a schematic flowchart of an electronic device control method according to an embodiment of this application.

In the control method shown in FIG. 20, an electronic device has different control manners depending on whether the electronic device works in an air operation mode. The following describes in detail step 9001 to step 9007 in the control method shown in FIG. 20.

9001: Start.

The step 9001 indicates starting to control or operate the electronic device.

9002: Determine whether the electronic device works in the air operation mode.

When it is determined in the step 9002 that the electronic device works in a non-air operation mode, step 9003 and step 9004 are performed. When it is determined in the step 9002 that the electronic device works in the air operation mode, step 9005 to step 9007 are performed.

In the step 9002, whether the electronic device works in the air operation mode may be specifically determined in the manner A to the manner D.

9003: Obtain a touchscreen or key operation signal of a user.

9004: Control the electronic device to perform an operation matching a touchscreen operation or a key operation of the user.

In the step 9003 and the step 9004, the user may control the electronic device in a conventional mode, for example, the touchscreen operation and the key operation.

9005: Obtain a detection signal of a capacitive sensor.

9006: Recognize an air gesture of the user based on the detection signal.

9007: Control the electronic device to perform an operation matching the air gesture of the user.

When the electronic device works in the air operation mode, by performing the steps 9005 to 9007, the user may control the electronic device by using the air gesture.

For specific content of the step 9005 to the step 9007, refer to the foregoing descriptions of the step 8001 to the step 8003. Details are not described herein again.

Figure 21:
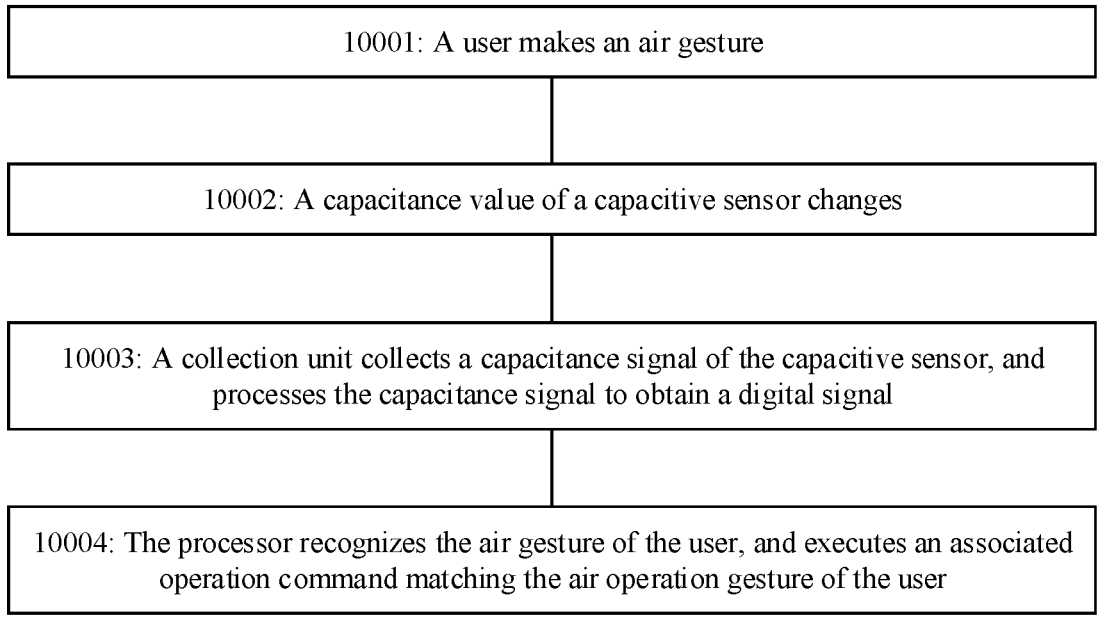
FIG. 21 is a schematic flowchart of an electronic device control method according to an embodiment of this application.

FIG. 21 is a schematic flowchart of an electronic device control method according to an embodiment of this application.

The control method shown in FIG. 21 includes step 10001 to step 10004. The following describes these steps.

10001: A user makes an air gesture.

The user may make some preset air gestures, to control an electronic device. For example, 10 air gestures (the 10 air gestures may include gestures such as a left-slide gesture, a right-slide gesture, a flip-up gesture, a flip-down gesture, and a confirmation gesture) are preset on an electronic device, and the 10 air gestures can implement control on the electronic device in different aspects. Therefore, the user may make any one of the 10 air gestures.

10002: A capacitance value of a capacitive sensor changes.

After the user makes the air gesture, because of fringe field effect of the capacitive sensor, the capacitance value of the capacitive sensor changes. A capacitance value change has a specific association relationship with the air gesture made by the user.

10003: A collection unit collects a capacitance signal of the capacitive sensor, and processes the capacitance signal to obtain a digital signal.

When the electronic device includes a plurality of capacitive sensors, capacitance values of the plurality of capacitive sensors may change. The collection unit may collect capacitance signals of the plurality of capacitive sensors, and process the capacitance signals of the plurality of capacitive sensors.

In the step 10003, to facilitate subsequent signal processing of a processor and better recognize the air gesture of the user, the capacitance signal may be first processed to some extent. Specifically, the capacitance signal may be converted into a voltage signal, and then the voltage signal is converted into the digital signal.

10004: The processor recognizes the air gesture of the user, and executes an associated operation command matching the air gesture of the user.

Figure 22:
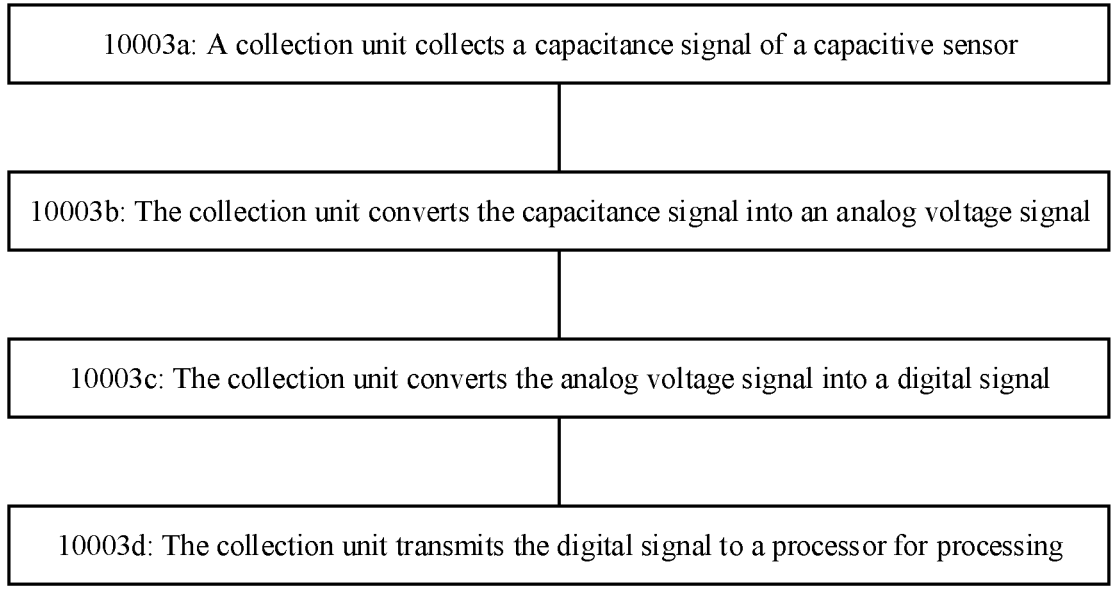
FIG. 22 is a schematic diagram of processing a capacitance signal by a collection unit.

FIG. 22 is a schematic diagram of processing the capacitance signal by the collection unit. As shown in FIG. 22, the step 10003 specifically includes the following steps.

10003a: The collection unit collects the capacitance signal of the capacitive sensor.

The capacitance signal may specifically indicate a (real-time) change of the capacitance value of the capacitive sensor.

10003b: The collection unit converts the capacitance signal into an analog voltage signal.

To facilitate subsequent processing of the processor, the capacitance signal may be first converted into the analog voltage signal, and then the analog voltage signal is converted into the digital signal.

10003c: The collection unit converts the analog voltage signal into the digital signal.

Specifically, the collection unit may include an analog-to-digital conversion chip. In the step 10003c, the analog voltage signal may be converted into the digital signal by using the analog-to-digital conversion chip in the collection unit.

10003d: The collection unit transmits the digital signal to the processor for processing.

The collection unit may transmit the digital signal to the processor through a serial peripheral interface (serial peripheral interface, SPI) protocol.

FIG. 23 is a schematic diagram of a processing process of the processor. As shown in FIG. 23, the step 10004 specifically includes the following steps.

10004a: The processor recognizes the air gesture of the user based on information about correspondences between the digital signal and various gestures.

The correspondences between the digital signal and various gestures in the step 10004a are similar to the foregoing first correspondence information. The foregoing first correspondence information indicates correspondences between different detection signals and different air gestures. The information about the correspondences between the digital signal and various gestures herein may refer to correspondences between different digital signals and different air gestures.

The correspondences between the digital signal and various gestures herein may be stored in the electronic device. After obtaining the digital signal, the processor in the electronic device may recognize, based on the correspondences between the digital signal and various gestures, an air gesture corresponding to the digital signal. The air gesture is the recognized air gesture of the user.

10004b: The processor determines the associated operation command matching the air gesture of the user in an air gesture library.

The air gesture library may store an associated operation command corresponding to each air gesture. For example, the air gesture library may include associated operation commands corresponding to or matching air gestures such as a left-slide gesture, a right-slide gesture, a flip-up gesture, a flip-down gesture, and a confirmation gesture.

After the air gesture of the user is determined, an associated operation command corresponding to or matching the air gesture of the user may be queried from the air gesture library. For example, when the air gesture of the user is recognized as a left-slide gesture, it may be determined, by using the air gesture library, that an operation command corresponding to the left-slide gesture is a first operation command. The first operation command is a command for controlling a display page of the electronic device to slide leftward.

10004c: The processor controls the electronic device to execute the associated operation command matching the air gesture of the user.

For example, when the air gesture of the user is the left-slide gesture, the operation command corresponding to the left-slide gesture is the first operation command, so that the processor may control the electronic device to execute the first operation command, so as to slide the display page leftward.

A person of ordinary skill in the art may be aware that, in combination with the examples described in embodiments disclosed in this specification, units and algorithm steps may be implemented by electronic hardware or a combination of computer software and electronic hardware. Whether the functions are performed by using hardware or software depends on particular applications and design constraints of technical solutions. A person skilled in the art may use different methods to implement the described functions for each particular application, but it should not be considered that the implementation goes beyond the scope of this application.

It may be clearly understood by a person skilled in the art that, for ease and brevity of description, for a detailed working process of foregoing systems, apparatuses, and units, refer to a corresponding process in the foregoing method embodiments. Details are not described herein again.

In the several embodiments provided in this application, it should be understood that the disclosed systems, apparatuses, and methods may be implemented in another manner. For example, the described apparatus embodiments are merely examples. For example, division into the units is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or another form.

The units described as separate parts may or may not be physically separate, and parts displayed as units may or may not be physical units, may be located in one position, or may be distributed on a plurality of network units. Some or all of the units may be selected based on actual requirements to achieve the objectives of the solutions of embodiments.

In addition, functional units in embodiments of this application may be integrated into one processing unit, or each of the units may exist alone physically, or two or more units are integrated into one unit.

When the functions are implemented in a form of a software functional unit and sold or used as an independent product, the functions may be stored in a computer-readable storage medium. Based on such an understanding, the technical solutions of this application essentially, or the part contributing to the conventional technology, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in embodiments of this application. The foregoing storage medium includes any medium that can store program code, such as a USB flash drive, a removable hard disk, a read-only memory (ROM), a random access memory (RAM), a magnetic disk, or an optical disc.

The foregoing descriptions are merely specific implementations of this application, but the protection scope of this application is not limited thereto. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. An electronic device, comprising:
   a capacitive sensor configured to detect an air gesture of a user and generate a detection signal based on fringe field effect, wherein the detection signal indicates a capacitance change of the capacitive sensor; and
   a control unit configured to recognize the air gesture of the user based on the detection signal and control the electronic device to perform an operation matching the air gesture of the user,
   wherein the capacitive sensor comprises M plate pairs, and wherein each of the M plate pairs comprises a first plate and a second plate that are placed opposite to each other, a ratio of a plate length of each plate pair to a spacing between the plates in each plate pair is greater than 1 and less than or equal to 30, and M is an integer greater than or equal to 1, and
   wherein the control unit is further configured to input the detection signal into a gesture recognition model for processing to recognize the air gesture of the user, wherein the gesture recognition model is a neural network model trained based on training data, and wherein the training data comprises a plurality of detection signals and air gestures corresponding to the plurality of detection signals.

2. The electronic device according to claim 1, wherein the first plate and the second plate in each plate pair are both made of a wavy conductive material.

3. The electronic device according to claim 1, wherein M is greater than 1 and the M plate pairs each are formed by alternately arranging the first plate and the second plate.

4. The electronic device according to claim 3, wherein the capacitive sensor further comprises:
   a first electrode, wherein all first plates in the M plate pairs are connected to the first electrode; and
   a second electrode, wherein all second plates in the M plate pairs are connected to the second electrode.

5. The electronic device according to claim 1, wherein M is less than or equal to 30.

6. The electronic device according to claim 1, wherein the ratio of the plate length of each plate pair to the spacing in each plate pair is greater than 1 and less than or equal to 15.

7. The electronic device according to claim 1, wherein the capacitive sensor is made of a flexible conductive material.

8. The electronic device according to claim 1, wherein the capacitive sensor is disposed on a surface of the electronic device in a 3D printing manner.

9. An electronic device control method, comprising:
- obtaining a detection signal of a capacitive sensor, wherein the detection signal is a signal generated based on fringe field effect in response to the capacitive sensor detecting an air gesture of a user, and wherein the detection signal indicates a capacitance change of the capacitive sensor;
- recognizing the air gesture of the user based on the detection signal by providing the detection signal as an input of a gesture recognition model to recognize the air gesture of the user, wherein the gesture recognition model is a neural network model trained based on training data, and wherein the training data comprises a plurality of detection signals and air gestures corresponding to the plurality of detection signals; and
- controlling the electronic device to perform an operation matching the air gesture of the user,
- wherein the capacitive sensor comprises M plate pairs, and wherein each of the M plate pairs comprises a first plate and a second plate that are placed opposite to each other, a ratio of a plate length of each plate pair to a spacing between the plates in each plate pair is greater than 1 and less than or equal to 30, and M is an integer greater than or equal to 1.

* * * * *